(12) United States Patent
Nervegna

(10) Patent No.: US 7,649,425 B2
(45) Date of Patent: Jan. 19, 2010

(54) PROGRAMMABLE PRECISION OSCILLATOR

(75) Inventor: Louis J. Nervegna, Somerville, MA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/395,367

(22) Filed: Mar. 31, 2006

(65) Prior Publication Data
US 2007/0241832 A1    Oct. 18, 2007

(51) Int. Cl.
*H03L 1/04* (2006.01)
*G06F 1/00* (2006.01)
(52) U.S. Cl. .................. 331/176; 331/111; 331/143; 713/500
(58) Field of Classification Search ................ 331/111, 331/143, 176; 713/500
See application file for complete search history.

(56) References Cited

U.S. PATENT DOCUMENTS

| 6,275,422 | B1 * | 8/2001 | Javanifard et al. ....... 365/189.07 |
| 6,373,256 | B1 * | 4/2002 | Hanjani et al. ............... 324/433 |
| 6,567,763 | B1 * | 5/2003 | Javanifard et al. ........... 702/130 |
| 2004/0057544 | A1 * | 3/2004 | Fernald ....................... 375/362 |

\* cited by examiner

*Primary Examiner*—Robert Pascal
*Assistant Examiner*—Levi Gannon
(74) *Attorney, Agent, or Firm*—Howison & Arnott, L.L.P.

(57) ABSTRACT

A free running clock circuit includes a switching circuit for switching between first and second logic states at a predetermined frequency based upon a trip voltage. The switching circuit has an inherent temperature profile associated therewith. A voltage divider circuit outputs a defined trip voltage that is compensated over the temperature to offset the temperature profile of said switching circuit to provide an overall temperature compensated operation for the free running clock circuit. The voltage divider circuit has a top programmable resistor array connected in series with at least two programmable resistor arrays between two supply terminals of differing voltages.

25 Claims, 14 Drawing Sheets

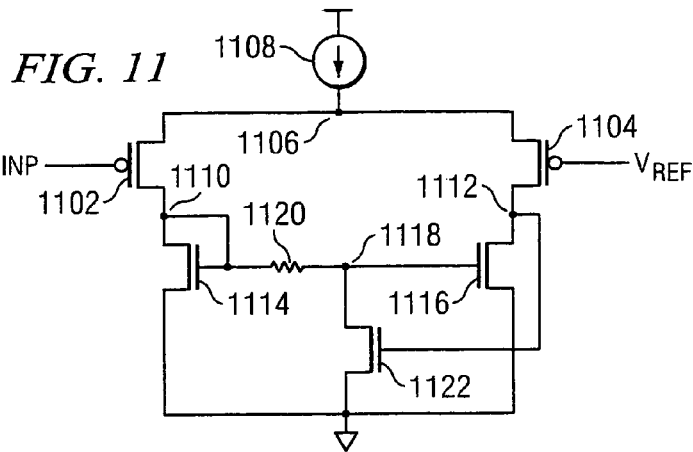
*FIG. 11*
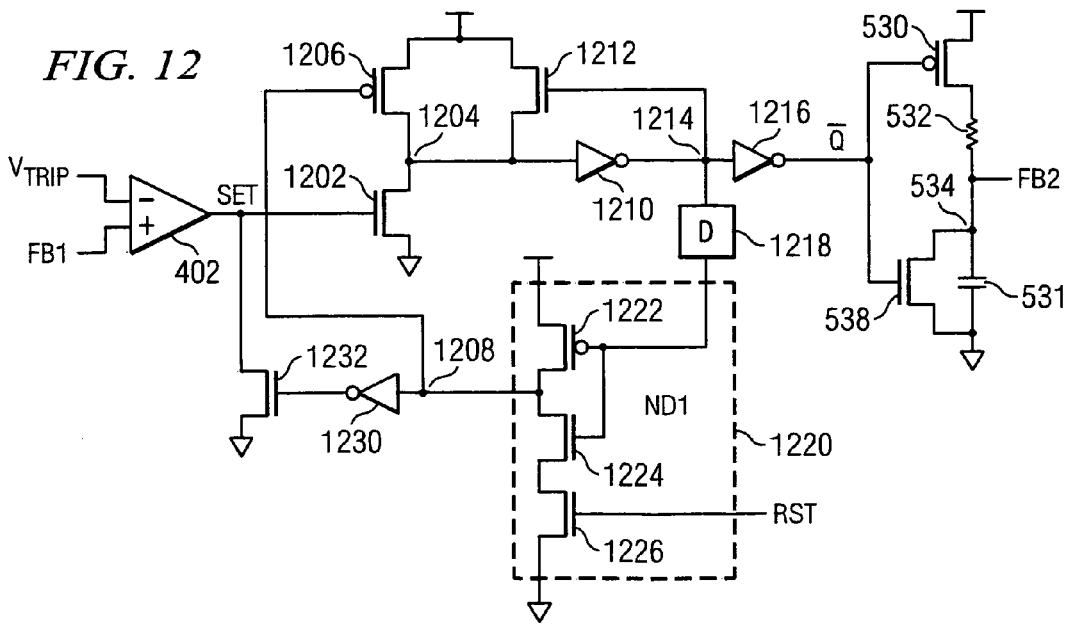
*FIG. 12*
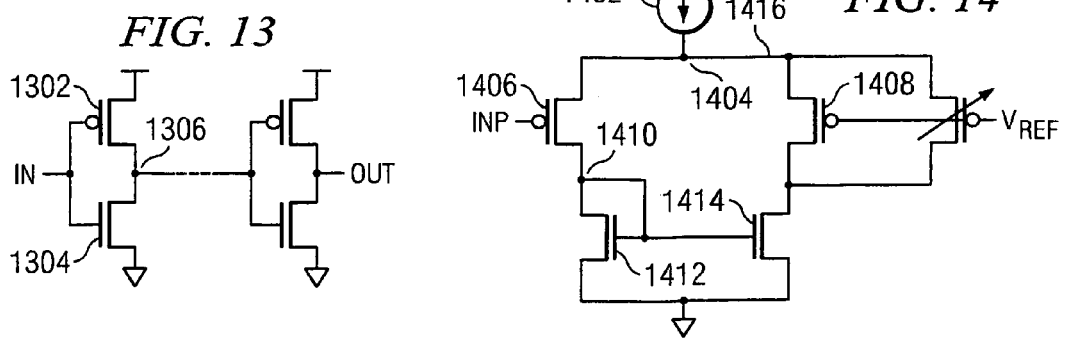
*FIG. 13*
*FIG. 14*

FIG. 16

| R/W | R/W | R/W | R/W | R/W | R/W | R/W | R/W | RESET VALUE |
|-----|-----|-----|-----|-----|-----|-----|-----|-------------|
| -   |     |     |     |     |     |     |     | VARIABLE SFR ADDRESS: |
| BIT7 | BIT6 | BIT5 | BIT4 | BIT3 | BIT2 | BIT1 | BIT0 | 0xB3 |

Bit7:     UNUSED. Read=0. Write=don't care.
Bits 6-0:   OSCICL: Internal Oscillator Calibration Register.
           This register determines the internal oscillator period

FIG. 17

| R/W | R/W | R/W | R | R/W | R/W | R/W | R/W | RESET VALUE |
|-----|-----|-----|---|-----|-----|-----|-----|-------------|
| -   | -   | -   | IFRDY | CLKSL | IOSCEN | IFCN1 | IFCN0 | 00010100 SFR ADDRESS: |
| BIT7 | BIT6 | BIT5 | BIT4 | BIT3 | BIT2 | BIT1 | BIT0 | 0xB2 |

Bits7-5:  UNUSED. Read=000b, Write=don't care.
Bit4:      IFRDY: Internal Oscillator Frequency Ready Flag.
         0: Internal Oscillator is not running at programmed frequency.
         1: Internal Oscillator is running at programmed frequency.
Bit3:      CLKSL: System Clock Source Select Bit.
         0: SYSCLK derived from the Internal Oscillator, and scaled as per the IFCN bits.
         1: SYSCLK derived from the External Oscillator circuit.
Bit2:      IOSCEN: Internal Oscillator Enable Bit.
         0: Internal Oscillator Disabled.
         1: Internal Oscillator Enabled.
Bits1-0:  IFCN1-0: Internal Oscillator Frequency Control Bits.
         00: SYSCLK derived from Internal Oscillator divided by 8.
         01: SYSCLK derived from Internal Oscillator divided by 4.
         10: SYSCLK derived from Internal Oscillator divided by 2.
         11: SYSCLK derived from Internal Oscillator divided by 1.

PROGRAMMABLE PRECISION OSCILLATOR

CROSS-REFERENCE TO RELATED APPLICATIONS

This present application is related to U.S. patent application Ser. No. 09/885,459, filed Jun. 19, 2001 and entitled "FIELD PROGRAMMABLE MIXED-SIGNAL INTEGRATED CIRCUIT", which is incorporated herein by reference; U.S. patent application Ser. No. 10/244,728, entitled "CLOCK RECOVERY METHOD FOR BURSTY COMMUNICATIONS," which is also incorporated herein by reference; and U.S. patent application Ser. No. 10/244,344, entitled "PRECISION OSCILLATOR FOR AN ASYNCHRONOUS TRANSMISSION SYSTEM", which is incorporated herein by reference.

TECHNICAL FIELD OF THE INVENTION

The present invention relates to oscillators, and more particularly, to the use of programmable resistor arrays to increase the frequency stability of oscillators.

BACKGROUND OF THE INVENTION

Universal, asynchronous transmitter/receivers (UARTs) are interface circuits, generally in the form of integrated circuit chips, which are disposed between a data providing circuit, such as, for example, a personal computer (PC) and a modem to provide parallel-to-serial and serial-to-parallel data conversion. Although UARTs can be stand-alone devices, they also can be incorporated into the communication port of a more complex integrated circuit chip. UARTs generally include an oscillator and a crystal to synchronize data conversion with a fairly precise oscillator frequency, which facilitates asynchronous communication between two remotely disposed UARTs. The purpose for having a crystal controlled oscillator is to ensure that the frequency of a specific UART is within a defined limit specified for UART operation. The use of an on-chip free-running oscillator, built entirely of integrated components, e.g. transistors, resistors, capacitors, inductors, etc., but no crystal, will typically not be acceptable due to temperature drift, manufacturing tolerances, supply voltage variation, etc. On the other hand, crystals are typically external devices, thus requiring a more complex external assembly.

A typical two-terminal integrated resistor consists of a series connection of three parts: a desired "pure" resistor part which is typically well-controlled during manufacturing, and two undesired parasitic "end" resistor parts, one on each side, which are typically very poorly controlled during manufacturing. For maximum precision with respect to temperature coefficient, the resistor network topology must be designed to maximize the contribution from the desired pure parts of the resistors and to minimize the contributions from the undesired parasitic end parts.

Moreover, digitally programming the resistor values requires the addition of transistor switches to the network. When turned on, a transistor used as a switch has an unwanted series on-resistance associated with it, which suffers from a high, nonlinear, and poorly-controlled temperature coefficient. When turned off, the transistor switch exhibits a sub-threshold leakage current which is very temperature and manufacturing dependent. These sub-threshold leakage currents are especially problematic in modern submicron CMOS processes, e.g. 0.18 micron processes. Unfortunately, there exists a fundamental physical trade off between on-resistance and sub-threshold leakage which cannot be avoided by simply changing the size of the transistor: making the sub-threshold leakage smaller makes the on-resistance larger, and vice versa. As a result of both on-resistance and sub-threshold leakage, the use of transistor switches within programmable resistor arrays destroys the otherwise very low, linear, and well-controlled temperature coefficient of the pure resistors themselves—unless special techniques are included to prevent this from happening. When the temperature coefficients of the resistors in the voltage reference circuit are degraded, so too is the temperature coefficient of the overall oscillator circuit, resulting in poor frequency stability of the oscillator. Thus, a programmable resistor array including the ability to digitally program temperature coefficients and the ability to control and minimize the effects of end resistances, switch on-resistances, and sub-threshold leakage currents, would be of great benefit.

SUMMARY OF THE INVENTION

The present invention disclosed and claimed herein, in one aspect thereof, comprises a free running clock circuit comprising a switching circuit and a voltage divider circuit. The switching circuit switches between first and second logic states at a predetermined frequency based upon a trip voltage. The logic circuit has an inherent temperature profile associated therewith. The voltage divider circuit outputs a defined trip voltage that is compensated over temperature to offset the temperature profile of said switching circuit to provide an overall temperature compensated operation for said free running clock circuit. The voltage divider circuit has a top programmable resistor array connected in series with at least two programmable resistor arrays connected in parallel with each other.

BRIEF DESCRIPTION OF THE DRAWINGS

For a more complete understanding of the present invention and the advantages thereof, reference is now made to the following description taken in conjunction with the accompanying Drawings in which:

FIG. 11 illustrates a schematic diagram of the comparator;

FIG. 12 illustrates a logic diagram for the S/R latch in combination with the comparator;

FIG. 13 illustrates a schematic diagram of the delay block;

FIG. 14 illustrates a schematic diagram for an offset circuit for the comparator;

FIGS. 16 and 17 illustrate tables for the oscillator controls;

FIG. 22 is a schematic diagram of an individual low leakage switch implemented within the programmable resistor array of FIG. 21; and FIG. 23 is a schematic diagram illustrating an implementation of a programmable resistor array for the top resistor of the resistor voltage divider providing a voltage input to the precision oscillator.

DETAILED DESCRIPTION OF THE INVENTION

Figure 1:
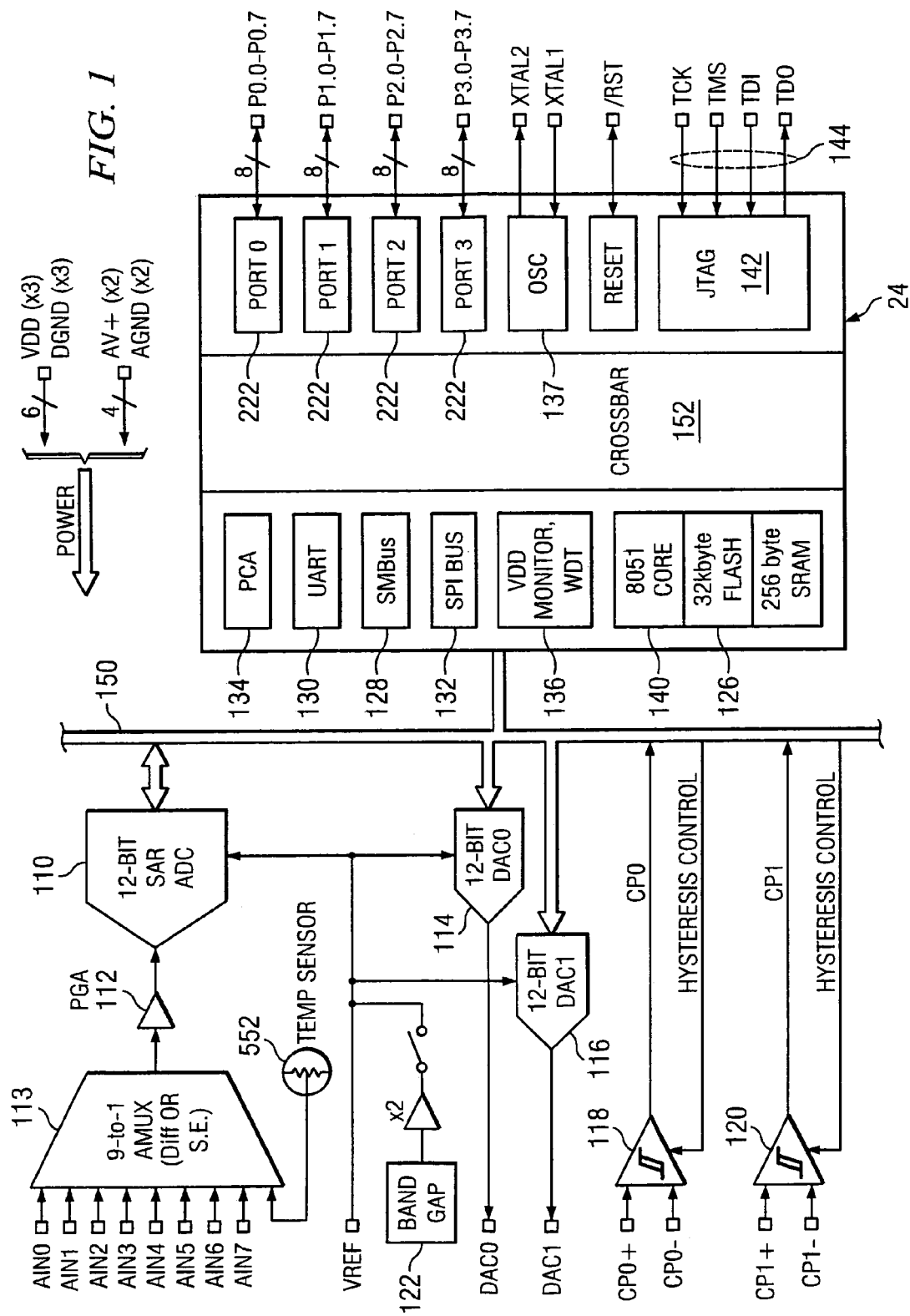
FIG. 1 illustrates an overall block diagram of a mixed-signal integrated circuit utilizing a UART in association with one of the communication ports.

Referring now to FIG. 1, there is illustrated an integrated circuit that is comprised of a fully integrated mixed-signal System on a Chip with a true 12-bit multi-channel ADC 110 with a programmable gain pre-amplifier s12, two 12-bit DACs 114 and 116, two voltage comparators 118 and 120, a voltage reference 22, and an 8051-compatible microcontroller core 124 with 32 kbytes of FLASH memory 126. There is also provided an I2C/SMBUS 128, a UART 130, and an SPI 132 serial interface 140 implemented in hardware (not "bit-banged" in user software) as well as a Programmable Counter/Timer Array (PCA) 134 with five capture/compare modules. There are also 32 general purpose digital Port I/Os. The analog side further includes a multiplexer 113 as operable to interface eight analog inputs to the programmable amplifier 112 and to the ADC 110.

With an on-board $V_{DD}$ monitor 136, WDT, and clock oscillator 137, the integrated circuit is a stand-alone System on a Chip. The MCU effectively configures and manages the analog and digital peripherals. The FLASH memory 126 can be reprogrammed even in-circuit, providing non-volatile data storage, and also allowing field upgrades of the 8051 firmware. The MCU can also individually shut down any or all of the peripherals to conserve power.

A JTAG interface 142 allows the user to interface with the integrated circuit through a conventional set of JTAG inputs 144. On-board JTAG emulation support allows non-intrusive (uses no on-chip resources), full speed, in-circuit emulation using the production integrated circuit installed in the final application. This emulation system supports inspection and modification of memory and registers, setting breakpoints, watch points, single stepping, run and halt commands. All analog and digital peripherals are fully functional when emulating using JTAG.

The microcontroller 140 is fully compatible with the MCS-51™ instruction set. Standard 803x/805x assemblers and compilers can be used to develop software. The core has all the peripherals included with a standard 8052, including three 16-bit counter/timers, a full-duplex UART, 256 bytes of internal RAM, 128 byte Special Function Register (SFR) address space, and four byte-wide I/O Ports.

Referring further to FIG. 1, the core 141 is interfaced through an internal BUS 150 to the various input/output blocks. A cross-bar switch 152 provides an interface between the UART 130, SPI BUS 132, etc., and the digital I/O output. This is a configurable interface. That can be associated with the $V_{DD}$ monitor 136.

The core 140 employs a pipelined architecture that greatly increases its instruction throughput over the standard 8051 architecture. In a standard 8051, all instructions except for MUL and DIV take 12 or 24 system clock cycles to execute with a maximum system clock of 12 MHz. By contrast, the core 140 core executes seventy percent (70%) of its instructions in one or two system clock cycles, with only four instructions taking more than four system clock cycles. The core 140 has a total of 109 instructions. The number of instructions versus the system clock cycles to execute them is as follows:

| | Instructions | | | | | | | | |
|---|---|---|---|---|---|---|---|---|---|
| | 26 | 50 | 5 | 14 | 7 | 3 | 1 | 2 | 1 |
| Clocks to Execute | 1 | 2 | 2/3 | 3 | 3/4 | 4 | 4/5 | 5 | 8 |

With the core 140's maximum system clock at 20 MHz, it has a peak throughput of 20 MIPS.

As an overview to the system of FIG. 1, the cross-bar switch 152 can be configured to interface any of the ports of the I/O side thereof to any of the functional blocks 128, 130, 132, 134 or 136 which provide interface between the cross-bar switch 152 and the core 140. Further, the cross-bar switch can also interface through these functional blocks 128-136 directly to the BUS 150.

Figure 2:
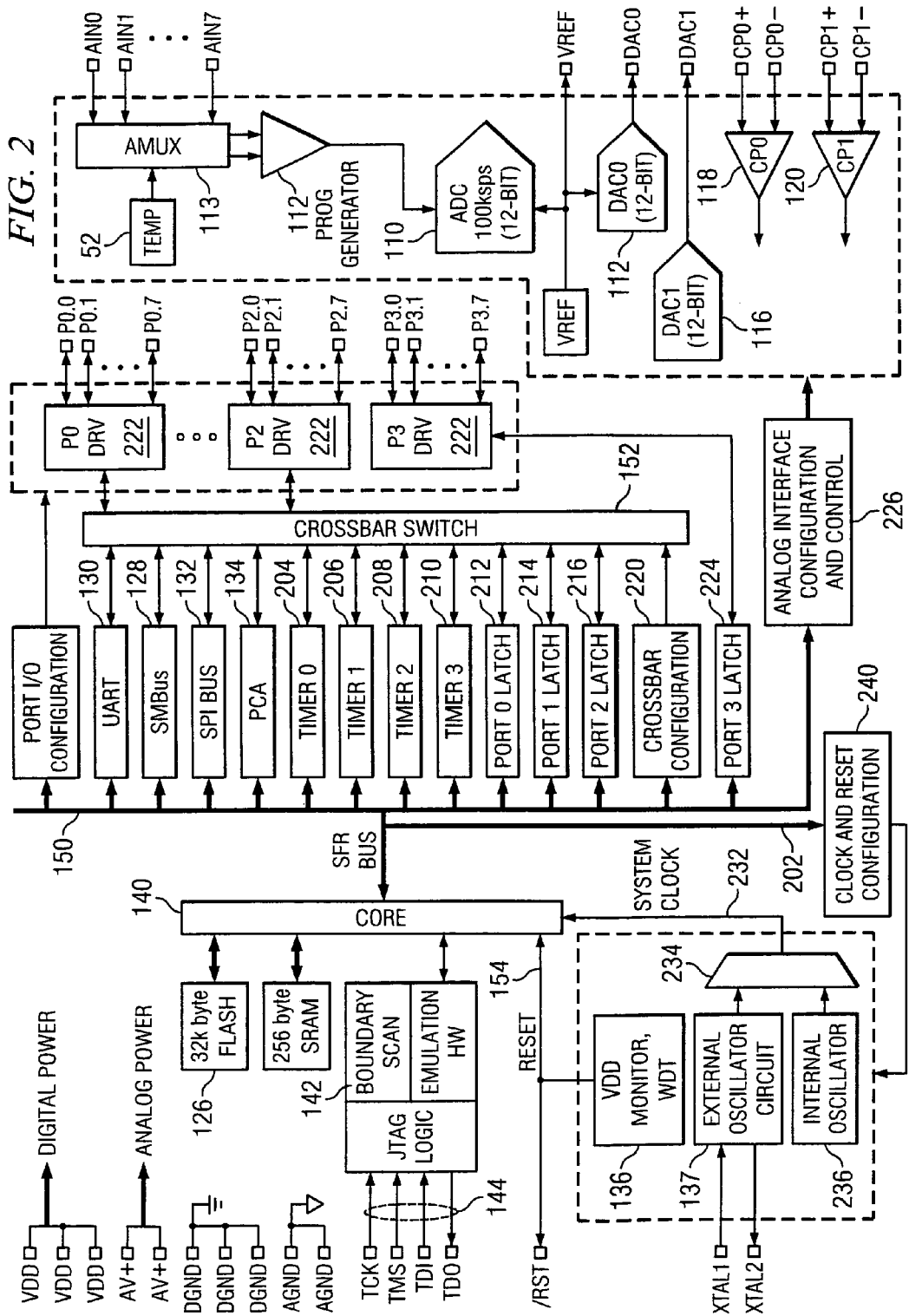
FIG. 2 illustrates a more detailed diagram of the integrated circuit of FIG. 1.

Referring now to FIG. 2, there is illustrated a more detailed block diagram of the integrated circuit of FIG. 1. In this embodiment, it can be seen that the cross-bar switch 152 actually interfaces to a system BUS 202 through the BUS 150. The BUS 150 is a BUS as operable to allow core 140 to interface with the various functional blocks 128-134 in addition to a plurality of timers 204, 206, 208 and 210, in addition to three latches 212, 214 and 216. The cross-bar switch 152 is configured with a configuration block 220 that is configured by the core 140. The other side of the cross-bar switch 152, the I/O side, is interfaced with various port drivers 222, which is controlled by a port latch 224 that interfaces with the BUS 150. In addition, the core 140 is operable to configure the analog side with an analog interface configuration in control block 226.

The core 140 is controlled by a clock on a line 232. The clock is selected from, as illustrated, one of two locations with a multiplexer 234. The first is external oscillator circuit 137 and the second is an internal oscillator 236. The internal oscillator circuit 236 is a precision temperature and supply compensated oscillator, as will be described herein below. The core 140 is also controlled by a reset input on a reset line 154. The reset signal is also generated by the watchdog timer (WDT) circuit 136, the clock and reset circuitry all controlled by clock and reset configuration block 240, which is controlled by the core 140. Therefore, it can be seen that the user can configure the system to operate with an external crystal oscillator or an internal precision non-crystal non-stabilized oscillator that is basically "free-running." This oscillator 236, as will be described herein below, generates the timing for both the core 140 and for the UART 130 timing and is stable over temperature.

Figure 3:
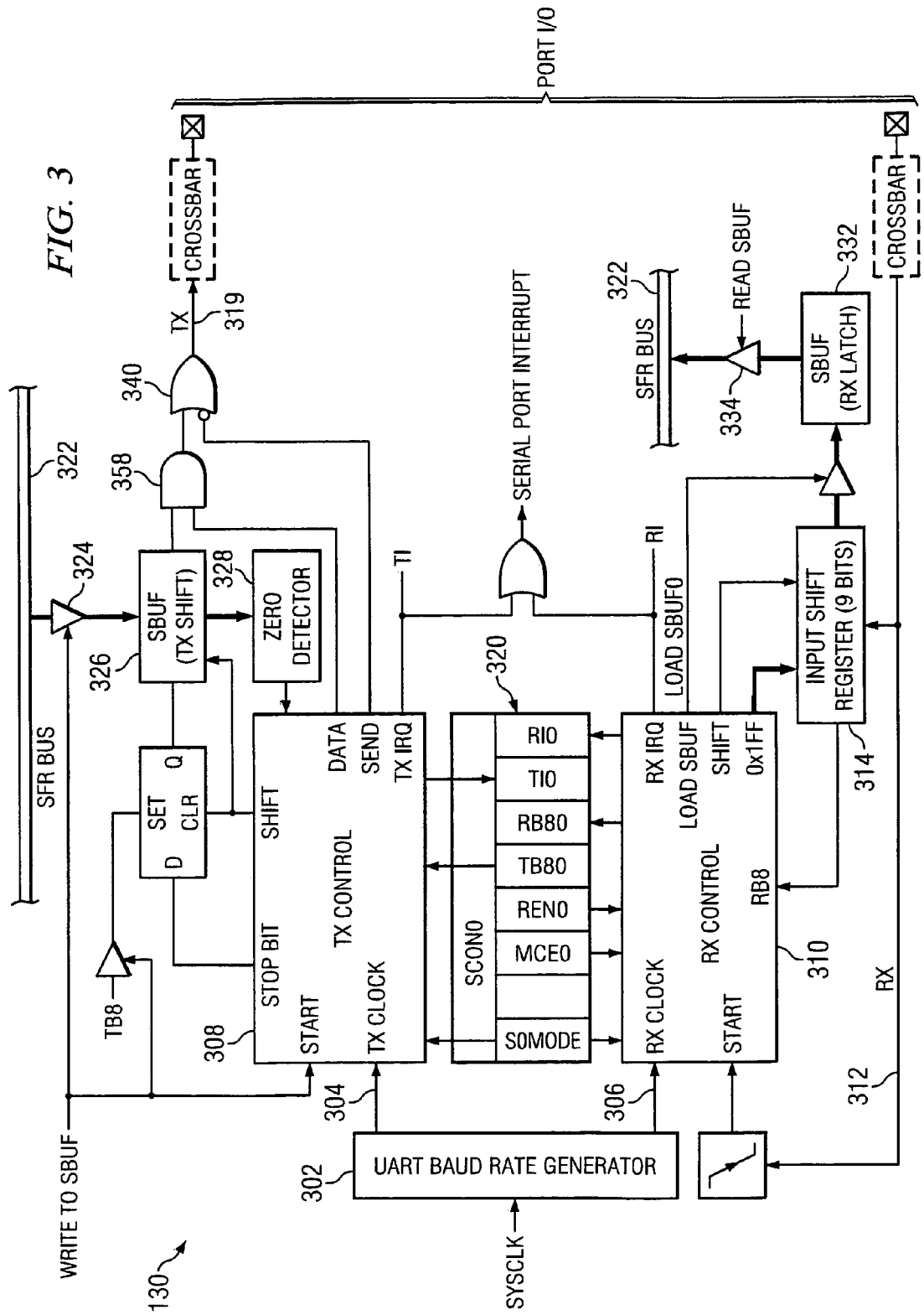
FIG. 3 illustrates a block diagram of the UART.

Referring now to FIG. 3, there is illustrated a block diagram of the UART 130. A system clock is input to a baud rated generator 302 which provides a transmit clock on the line 304 and a receive clock on a line 306. The transmit clock is input to a transmit control block 308 and the receive clock is input to a receive control block 310. A serial control register (SCON0) 320 is provided that is operable to provide control signals to the control blocks 308 and 310. The transmit data is received from a bus 322 and is input through a gate 324 to a serial data buffer (SBUF) 326. The output of this data is input to a zero detector 328 and then to a control block 308. The system is an asynchronous, full duplex serial port device and two associated special function registers, a serial control register (SCON0) 320 and a serial data buffer (SBUF0) (not shown), are provided. Data is received on a line 312 and is input to an input shift register 314. This is controlled by the control block 310 to output the shifted-in data to a latch 332 and then through a gate 334 to an SFR bus 322. In transmit mode, data is received from an SFR bus 321 and input through a gate 324 to a transmit shift register 326 which is output to a transmit line 319 from the register 326 or from the control block 308 through an AND gate 338 which is input to one input of an OR gate 340 to the transmit line 319. This is all controlled by the control block 308.

Figure 3A:
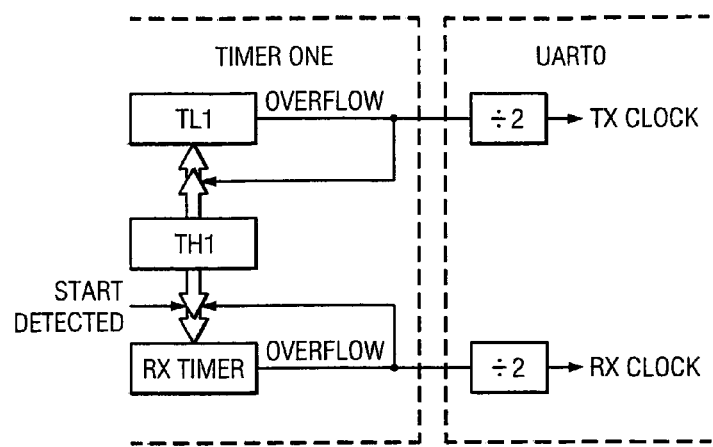
FIG. 3A illustrates a block diagram of the baud rate generator.

Referring now to FIG. 3A, there is illustrated a block diagram of the baud rate generator 302. This baud rate is generated by a timer wherein a transmit clock is generated by a block TL1 and the receive clock is generated by a copy of the TL1 illustrated as an RX Timer, which copy of TL1 is not user-accessible. Both the transmit and receive timer overflows are divided by two for the transmit clock and the receive clock baud rates. The receive timer runs when timer 1 is enabled, and uses the same TH1 value, this being a reload value. However, an RX Timer reload is forced when Start Condition is detected on the receive pin. This allows a receipt to begin any time a Start is detected, independent of the state of the transmit timer.

Figure 4:
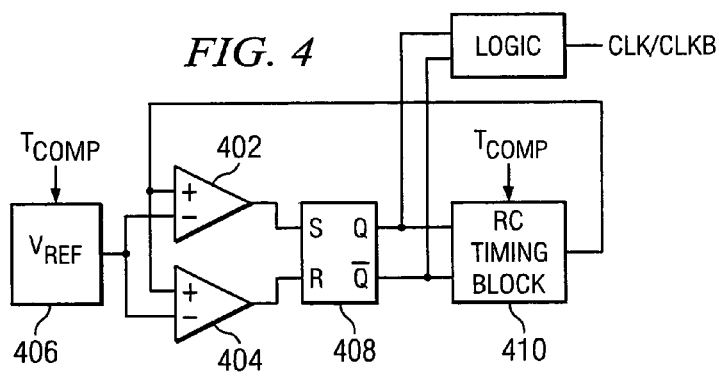
FIG. 4 illustrates a block diagram of the precision oscillator.

Referring now to FIG. 4, there is illustrated a diagrammatic view of the precision internal oscillator 236 that is disposed on integrated circuit. The integrated circuit, as noted hereinabove, is a commercially available integrated circuit that incorporates the precision oscillator 236 in association therewith. The integrated circuit provides the capability of selecting a crystal oscillator wherein a crystal is disposed between two crystal ports, selecting an external clock signal or selecting an internal free-running oscillator. The free-running oscillator is illustrated in FIG. 4 as the precision oscillator 236. At the center of the oscillator are two comparators, a first comparator 402 and a second comparator 404. A temperature compensated voltage reference circuit 406 is provided that provides a temperature compensated voltage reference (the trip voltage $V_{TRIP}$) to the negative inputs of the comparators 402. The outputs of the comparators 402 and 404 are connected to the Set and Reset, respectively, inputs of an S/R latch 408. The Q and Q-Bar outputs thereof are input to an output RC timing circuit 410 that is operable to define the period of the oscillator, the output of the S/R latch 408 providing the output clock signal. The output of this RC timing circuit 410 is fed back to the positive inputs of the comparators 402 and 404. The output RC timing circuit 410 is also temperature compensated. As will be described herein below, the voltage reference block 406 provides a negative temperature coefficient, whereas the comparators 402 and S/R latch 408 combination provide a positive temperature coefficient and the output RC timing circuit 410 provide a positive temperature coefficient. The overall combined coefficient will be approximately zero, as will be described herein below.

Figure 5:
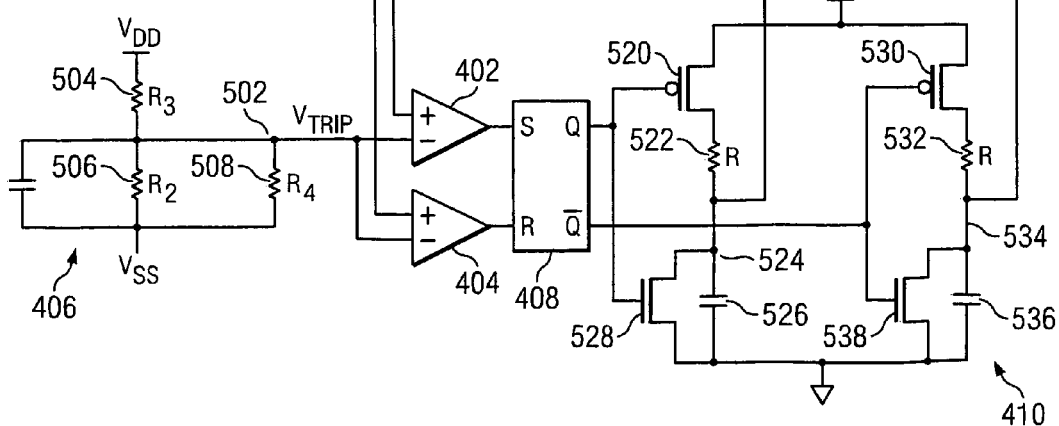
FIG. 5 illustrates a more detailed diagram of the precision oscillator of FIG. 4.

Referring now to FIG. 5, there is illustrated a more detailed diagrammatic view of the precision oscillator of FIG. 4. The voltage reference circuit 406 is comprised of a voltage divider that divides the supply voltage $V_{DD}$ to a voltage $V_{TRIP}$ on a node 502. The voltage divider is comprised of a top resistor 504 labeled $R_3$. The bottom half of the voltage divider is comprised of two parallel resistors, a resistor 506 labeled $R_2$ and a resistor 508 labeled $R_4$. For nomenclature purposes, the resistors will be referred as $R_2$, $R_3$ and $R_4$.

Resistors $R_3$ and $R_4$ are fabricated from the same material to provide a positive temperature coefficient. These are fabricated from the N-diffusion material, which has a positive temperature coefficient. By comparison, $R_2$ is manufactured from polycrystalline silicon in the first layer which is referred to as Poly1 material, and which also has a positive temperature coefficient, but which differs. It should be understood that different materials could be utilized, it only being necessary that there be two resistors having different temperature coefficients. Although not a part of this disclosure, Poly1 material is basically the first layer of polycrystalline silicon that is disposed on the substrate over a protective oxide layer, from which such structures as the gates of transistors are fabricated. With the positive temperature coefficients of the resistors, this will result in the voltage $V_{TRIP}$ having a negative coefficient. As will be described herein below, the resistors being of different materials facilitates adjustments between the two resistors $R_2$ and $R_4$ to vary the temperature coefficient. This is primarily due to the fact that they are of differing materials.

Figure 6:
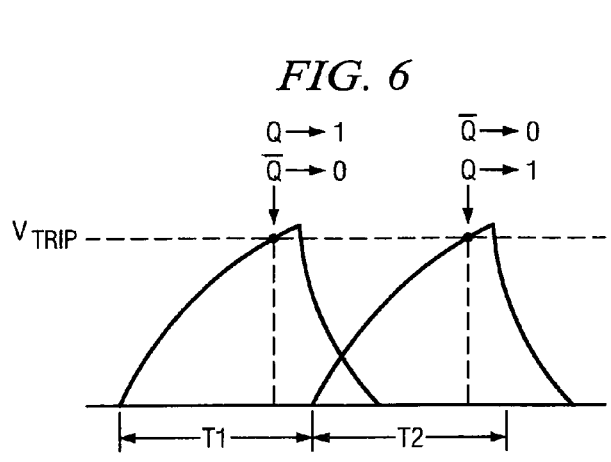
FIG. 6 illustrates an output waveform diagram of a precision oscillator.

The output RC timing circuit 410 is comprised of two RC circuits. The first RC circuit is comprised of a P-channel transistor 520 having the source/drain path thereof connected between $V_{DD}$ and one side of a resistor 522 labeled R, the other end thereof connected to a node 524. Node 524 is connected to one side of a capacitor 526, the other side of the capacitor 526 connected to $V_{SS}$.—channel transistor 528 has the source/drain path thereof connected across capacitor 526, and the gate thereof connected to the gate of P-channel transistor 520 and also to the Q-output of the S/R latch 408. Node 524 comprises the positive input of the comparator 402. The second RC network is comprised of a P-channel transistor 530 having the source/drain path thereof connected between $V_{DD}$ and one side of a resistor 532 (labeled R), the other side of resistor 532 connected to a node 534. Node 534 is connected to one side of a capacitor 536, the other side thereof connected to $V_{SS}$. An N-channel transistor 538 has the source/drain path thereof connected between node 534 and $V_{SS}$. The gate of transistor 538 is connected to the gate of transistor 530 and also to the Q-Bar output of S/R latch 408. The node 534 comprises the positive input of the comparator 404. The output waveform for the circuit of FIG. 5 is illustrated in FIG. 6, wherein conventional RC rise and fall curves are illustrated for each of the RC circuits. The period of each output waveform is defined from the initial turn-on point where voltage is applied to the resistor R to the point where resistor R of the other of the RC circuits is turned on. There will be period T1 and a period T2 for each of the RC circuits, respectively. The sum of the two periods is equal to the period for the oscillator. Transistors 520, 530, 528 and 538 are sized such that their resistances are substantially less than the value of resistors 522 and 532. The resistors 522 and 532 are fabricated from Poly1 material due to its low temperature coefficient. The period of the oscillator is the sum of the period T1 and the period T2+2 times the delay of the comparators.

Figure 7:
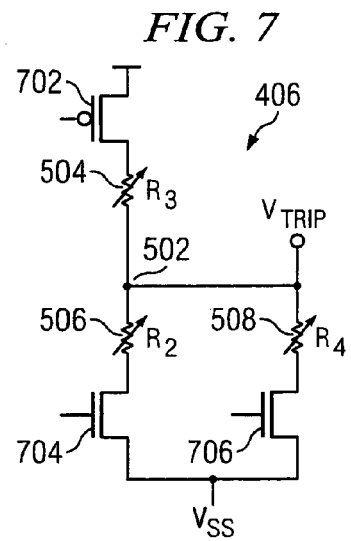
FIG. 7 illustrates a schematic diagram of the temperature compensated reference voltage.

Referring now to FIG. 7, there is illustrated more detailed block diagram of the implementation of the voltage reference 406. The resistor 504 which is illustrated in FIG. 5 as being connected to $V_{DD}$ is actually connected through the source/drain of the P-channel resistor 702 to $V_{DD}$ with the gate thereof connected to a bias voltage. Similarly, the bottom end of resistor 506 is connected to $V_{SS}$ through the source/drain path of a N-channel transistor 706 to $V_{SS}$, the gates of both transistors 704 and 706 connected to a bias. Transistors 702, 704 and 706 are sized such that their resistances are substantially less than the value of resistors $R_2$, $R_3$ and $R_4$. Also, first order power supply independence comes from the fact that the trip voltage $V_{Trip}$ is proportional to the supply voltage, i.e., $V_{DD}*(1-e(t/\tau))$. Therefore, in the time it takes to reach the trip voltage at the input of the comparator is supply independent to the first order. This is one reason that the RC timing circuits are utilized rather than a current source charging a capacitor, which does not provide the first order cancellation.

$$V_{Trip} = V_{DD} * \text{ratio}$$

$$V_{Trip} = V_{DD} * (1 - e(-T1/\tau))$$

$$T1 = -*\ln(1 - V_{Trip}/V_{DD})$$

$$\text{Thus: } T1 = -\tau * \ln(1 - \text{ratio})$$

From a temperature compensation standpoint, there are a number of aspects of the voltage reference circuit 406 that can be utilized to provide temperature compensation. Commonly, the resistors have a set variation with respect to temperature. The Poly1 resistor $R_2$ has a temperature coefficient of 255 ppm whereas the N-diffused resistors $R_3$ and $R_4$ have a temperature coefficient of 800 ppm. In the present disclosure, it is desirable to have a negative coefficient of 462 ppm.

To analyze how a negative temperature coefficient is created with the resistors $R_2$, $R_3$ and $R_4$, consider that $R_2$ and $R_4$ are a parallel combination defined as $REQ=R_2//R_4$. If REQ and $R_3$ have different temperature coefficients with $TCR_3>TCREQ$, then the trip voltage will have a negative temperature coefficient. $V_{TRIP}$ will be defined as follows:

$$V_{TRIP} = \frac{REQ}{R_3 + REQ} V_{DD}$$

$$\frac{1}{V_{TRIP}} \frac{dV_{TRIP}}{dT} = \frac{R_3}{R_3 + REQ}\left[\frac{1}{REQ}\frac{dREQ}{dT}\right] - \frac{R_3}{R_3 + REQ}\left[\frac{1}{R_3}\frac{dR_3}{dT}\right]$$

$$\frac{1}{V_{TRIP}} \frac{dV_{TRIP}}{dT} = \frac{R_2}{R_3 + REQ}[TCREQ - TCR_3]$$

For REQ, is must be assumed that $V_{TRIP}$ is a fixed value, such that $R_2$ and $R_4$ can be varied to target a specific temperature coefficient. This can be shown by the following equations:

$$\frac{1}{REQ}\frac{dREQ}{dT} = \frac{\left[\frac{1}{R_2}\frac{dR_2}{dT}\right] + \left[\frac{1}{R_4}\frac{dR_4}{dT}\right] -}{\frac{R_2}{R_2+R_4}\left[\frac{1}{R_2}\frac{dR_2}{dT}\right] - \frac{R_4}{R_2+R_4}\left[\frac{1}{R_4}\frac{dR_4}{dT}\right]}$$

$$TCREQ = TCR_2 + TCR_4 - \frac{R_2}{R_2+R_4}TCR_2 - \frac{R_4}{R_2+R_4}TCR_4$$

The results of equation 5 can be utilized in equation 3 to set the final temperature coefficient of $V_{TRIP}$.

Figure 8:
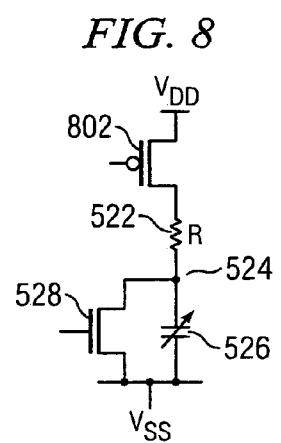
FIG. 8 illustrates a schematic diagram of one-half of the output wave shaping circuit.

Referring now to FIG. 8, there is illustrated a detailed diagram of the implementation of one-half of the charging structure 410. This, as with the case with respect to the voltage reference structure 406, there is provided a P-channel transistor 802 for connecting the top end of the resistor 522 to $V_{DD}$, with the gate thereof connected to a bias supply. This P-channel transistor introduces very little error in the temperature operation thereof. Capacitor 526 is a variable capacitor, such that the value thereof can be varied to set the period for the oscillator. The capacitor 526 is fabricated from an insulator disposed between the first layer poly, P1, and the second layer poly, P2, with a layer of oxide disposed there between. The resistor 522 is an N-diffusion resistor.

The resistors $R_3$, $R_2$ and $R_4$ in the voltage reference circuit 406 are variable resistors that can be mask programmable resistors. Resistor $R_3$ is utilized to set the value of $V_{TRIP}$ and resistors $R_2$ and $R_4$ are utilized to select a temperature coefficient, since they have dissimilar temperature coefficients.

Figure 9:
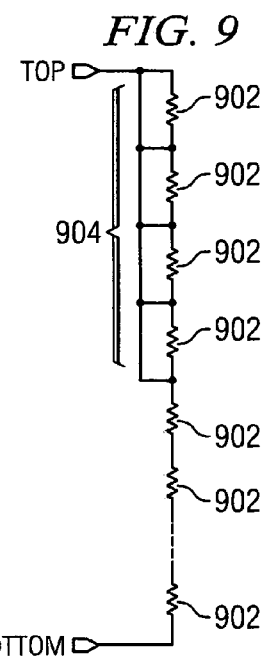
FIG. 9 illustrates a schematic diagram/layout for one of the resistors illustrating the mask programmable feature thereof.

FIG. 9 illustrates a layout for one of the resistors $R_2$-$R_4$. A plurality of series connected resistors are provided that are fabricated in either the substrate with an N-type diffusion or in the Poly1 layer. These resistors provide a mask programmable set of connections 904 to allow one or more resistors 902 to be added into the resistor string, they being initially shorted out. Although not shown, there is also provided the ability to short additional ones of the resistors to decrease the value. This is mask programmable and is utilized to "tweak" the design at the metal level.

Figure 10:
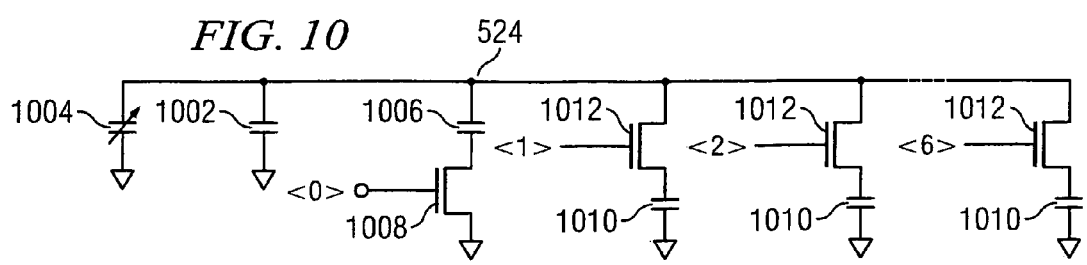
FIG. 10 illustrates a schematic diagram of the programmable capacitor.

Referring now to FIG. 10, there is illustrated a diagrammatic view of the capacitor 526, which is a register programmable capacitor to allow for adjustment of the center frequency. There is provided a nominal capacitor 1002 which has a value of 380 fF, which is connected between node 24 and $V_{SS}$. In parallel therewith, there is also provided a mask programmable capacitor 1004 that provides for eight steps of programming in increments of 39.5 fF. The register programmable capacitors are provided with a capacitor 1006 of value "C" that is connected between a node 524 and one side of the source/drain path of an N-channel transistor 1008, the gate thereof connected to the LSB bit. The configuration of the capacitor 1006 disposed between the switching transistor 1008 and the node 524 is only used for LSB. This structure allows the use of the smaller unit capacitor, but there is some non-linear capacitance that is introduced from the source/drain of the transistor 1008 and, also, the wire bonds. The remaining selectable capacitors are each comprised of a capacitor 1010 which is connected between $V_{SS}$ and one side of the source/drain path of an N-channel transistor 1012, the other side thereof connected to node 524 and the gate thereof connected to the bits [1] through [6]. The value of the capacitor 1010 associated with bit <1> is a value of "C", with the next selectable capacitor 1010 having the associated transistor gate connected to the bit value <2> and the last of the selectable capacitor 1010 having the gate of the associated transistor connected to the bit <6> and a value of 32 C. This is a binary tree, with the LSB providing an LSB of approximately C/2.

Referring now to FIG. 11, there is illustrated a diagrammatic view of the differential input structure for each of the comparators 402 and 404. There are provided two differential P-channel transistors 1102 and 1104 having one side of the source/drain paths thereof connected to a node 1106, node 1106 connected through a current source 1108 to $V_{DD}$. The other side of the source/drain path of transistor 1102 is connected to a node 1110 and the other side of the source/drain path of transistor 1104 is connected to a node 1112. The gate of transistor 1102 comprises the positive input and the gate of transistor 1104 comprises the negative input connected to $V_{REF}$. Node 1110 is connected to one side of the source/drain path of an N-channel transistor 1114 and the gate thereof, the other side of the source/drain path of transistor 1114 connected to $V_{SS}$. Node 1112 is connected to one side of the source/drain path of an N-channel transistor 1116, the other side thereof connected to $V_{SS}$ and the gate thereof connected to a node 1118, node 1118 connected to one side of a resistor 1120, the other side thereof connected to the gate of transistor 1114. Node 1112 is also connected to the gate of an N-channel transistor 1122, the source/drain path thereof connected between node 1118 and $V_{SS}$. This structure is referred to as a modified Flynn-Lidholm latching comparator which provides a Set/Reset latch with dynamic logic, described in Flynn M. Lidholm S. U., "A 1.2 μm CMOS Current Controlled Oscillator, IEEE Journal of Solid state Circuits," Vol. 27 No. 7 July 1992.

Referring now to FIG. 12, there is illustrated a diagrammatic view of the comparator 402 and one-half of the S/R latch 408 illustrating the Q-Bar output. The one-half of the S/R latch 408 has the Set input thereof connected to the output of comparator 402 and input to the gate of an N-channel transistor 1202, the source/drain path thereof connected between a node 1204 and $V_{SS}$. A P-channel transistor 1206 has the source/drain path thereof connected between node 1204 and $V_{DD}$, the gate thereof connected to a node 1208. Node 1204 is connected to the input of a conventional inverter 1210 and also to one side of the source/drain path of an N-channel transistor 1212, the other side thereof connected to $V_{DD}$ and the gate thereof connected to a node 1214, which node 1214 is also connected to the output of inverter 1210. Node 1214 is connected to the input of an inverter 1216, the output thereof providing the Q-Bar output. Node 1214 also is connected through a delay block 1218 to the input of a NAND gate 1220 labeled "ND1." NAND gate 1220 is comprised of a P-channel transistor 1222 having the source/drain path thereof connected between $V_{SS}$ and the node 1208 and an N-channel transistor 1224 having the source/drain path thereof connected between the node 1204 and one side of the source/drain path of an N-channel transistor 1226, the other side thereof connected to $V_{SS}$. The gates of transistors 1222 and 1224 are connected to the output of the delay block 1218. The gate of transistor 1226 is connected to the reset input "RST" from the other side of the S/R latch 408. Node 1208 is connected to the input of an inverter 1230, the output thereof driving the gate of an N-channel transistor 1232 having the source/drain path thereof connected between the output of the comparator 402, the SET input of latch 408, and the other side of the source/drain path of transistor 1232 connected to $V_{SS}$. The parallel structure to that associated with the output of comparator 402 in FIG. 12 is provided for the output of comparator 404 for the Reset input.

In operation, when the positive input of comparator 402, FB1, charges up, SET starts to go high. As it reaches the threshold voltage $V_{TH}$ of transistor 1202, Q-Bar begins to go low and, at the same time, the other side of the latch, which has a NAND gate ND2 similar to ND1, begins to go low and pulls down RST. When RST is pulled down, this then sets the Q-output. Initially, it is assumed that Q-Bar is set to a value of "1" and the Q-output is set to "0" with FB1 equaling "0" on comparator 402 and FB2 on the positive input of comparator 404 being initially set to "1" with SET=0 and RST=1. The delay block 1218 prevents ND1 from pulling down the SET value before RST goes low. RST going low ensures that the pull down input is low (or ND1 high) to result in a symmetric process for SET/RST.

Referring now to FIG. 13, there is illustrated a schematic diagram of the delay block 1218. This delay block is comprised of a plurality of series connected invertors comprised of two series connected transistors, a P-channel transistor 1302 and an N-channel transistor 1304, with the gates thereof connected together and one side of the source/drain path thereof connected to a node 1306, transistor 1302 connected between $V_{DD}$ and $V_{SS}$.

Referring now to FIG. 14, there is illustrated a diagrammatic view of a simplified comparator illustrating how supply independence is enhanced. The comparator of FIG. 14 is illustrated with a current source 1402 disposed between $V_{DD}$ and a node 1404, node 1404 connected to one side of two differential connected P-channel transistors 1406 and 1408. The gate of transistor 1406 is connected to one input, whereas the gate of transistor 1408 is connected to the other $V_{REF}$ input. The other side of the source/drain path of transistor 1406 is connected to a node 1410, which is connected to one side of the source/drain path of an N-channel 1412, the other side thereof connected to ground and the gate thereof connected to both the drain thereof on node 1410 and to the gate of an N-channel transistor 1414. Transistor 1414 has the source/drain path thereof connected between the other side of transistor 1408 and $V_{SS}$. Additionally, an offset transistor(s) 1416 of the P-channel type has the source/drain path thereof connected across the source/drain path of transistor 1408, the gate thereof connected to $V_{REF}$ and also to the gate of transistor 1408. Transistor 1416 represents selectable transistors that are mask programmable to select a predetermined offset in the comparator. This offset at the input of the comparators aid in the supply independence. Without offset, the following would be true:

With offset:

$$T_{Period}=2*(-\tau*\ln(1-V_{Trip}/V_{DD})+T_{Delay(comp)})$$

$$T_{Period}=2*(-\tau*\ln(1-\text{ratio})+T_{Delay(comp)})$$

$$V_{Trip}=\text{ratio}*V_{DD}$$

Without offset:

$$V_{Trip}=V_{Trip}+V_{OS}$$

$$T_{Period}=2*(-\tau*\ln(1-\text{ratio}-V_{os}/V_{DD})+T_{Delay(comp)})$$

From these equations, it can be seen that $V_{DD}$ dependence has been added. Power supply dependence can be added or subtracted by varying the transistors 1416, noting that there could be variable transistors across transistor 1406 also. This way, the offset can be made negative or positive. Again, this is a mask programmable system.

Figure 15:
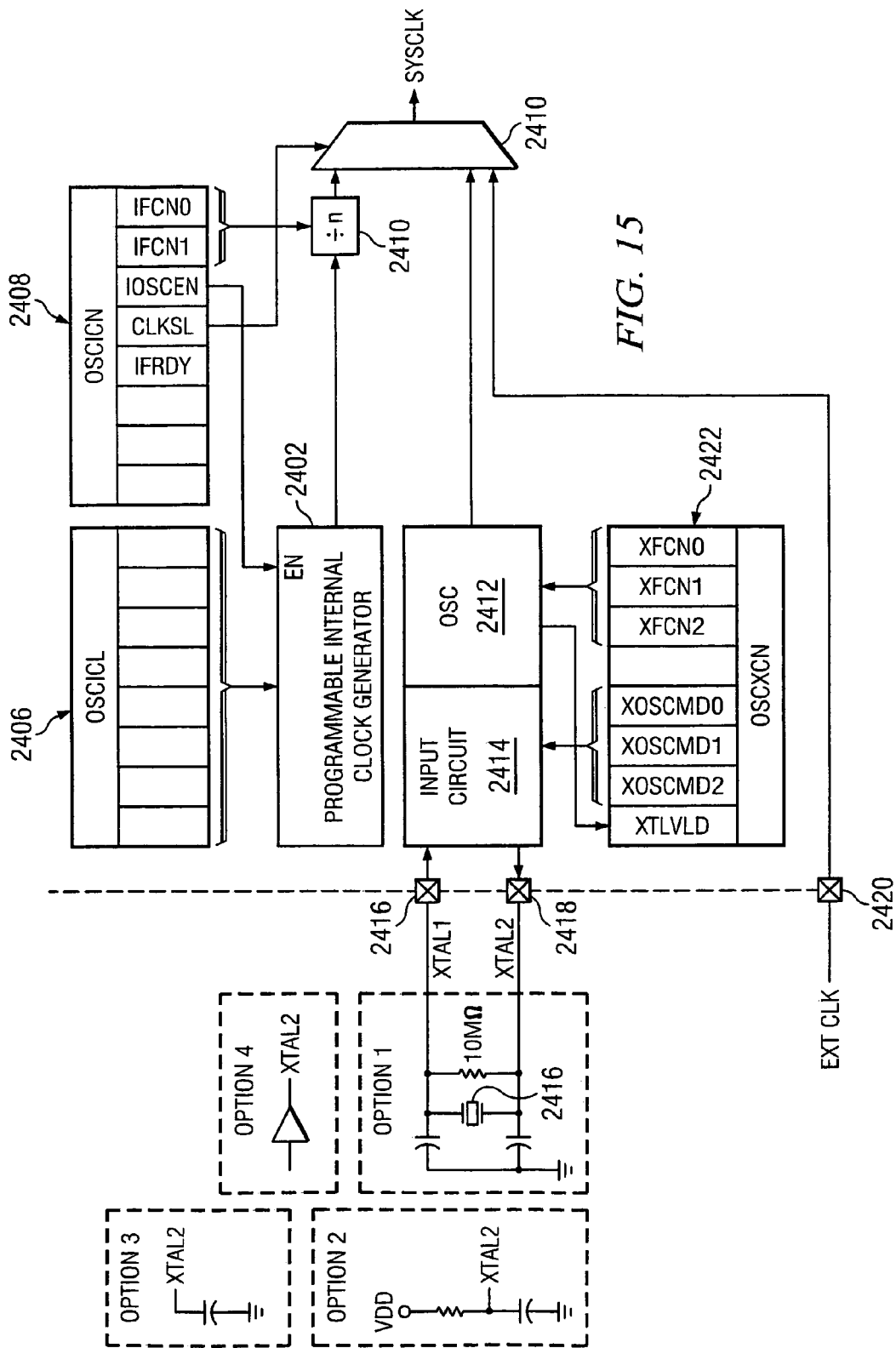
FIG. 15 illustrates a block diagram of one instantiation of the oscillator.

Referring now to FIG. 15, there is illustrated a diagrammatic view of one instantiation of the precision oscillator. In the oscillator implemented on the integrated circuit, a programmable internal clock generator 2402 is provided that is controlled by a register 2406 and a register 2408. The output of the internal clock generator is input to a divide circuit 2410, which is also controlled by the register 2408, the output thereof being input to one input of a multiplexer 2410. This multiplexer 2410 is controlled by the register 2408. Register 2410 outputs the system clock (SYSCLK), which is input to the baud rate generator 302. In addition to an internal clock generator, there is also a provision for an external crystal controlled oscillator. A crystal controlled internal or on-chip oscillator 2412 is provided that is interfaced through an input circuit 2414 to terminals 2416 and 2418 to an external crystal 2416. The output of the oscillator 2412 is input to one input of the multiplexer 2410. Additionally, an external clock is provided on a terminal 2420 that is also input to one input of the multiplexer 2410. The crystal controlled oscillator 2412 is controlled by a register 2422.

The internal oscillator 2402 is provided such that it will be the default system clock after a system reset. The internal oscillator period can be programmed with the register 2406 by the following equation:

$$\Delta T \cong 0.0025 \times \frac{1}{f_{BASE}} \times \Delta OSCICL$$

wherein $f_{BASE}$ is a frequency of the internal oscillator followed by a reset, $\Delta T$ is the change in internal oscillator, and $\Delta OSCICL$ is a change to the value held in the register 2406. Typically, the register 2406 will be factory calibrated to a defined frequency such as, in one example, 12.0 MHz.

Referring now to FIG. 16, there is illustrated a table for register 2406 wherein it can be seen that bits 6-0 are associated with the calibration register of the oscillator and its value can be changed internally. FIG. 17 illustrates the control register 2408 illustrating the controls provided therefor.

The use of digitally programmable resistor networks is proposed for the purpose of increasing the frequency stability of oscillators, in particular with respect to temperature drift and supply voltage variation, so that these oscillators may approach the frequency stability of crystals. In this way, the entire oscillator assembly may be integrated on-chip. The proposed programmable resistor networks are constructed in special topologies from integrated resistors of differing materials and from integrated transistors used as switches. Associated digital logic is also included to control the special switching sequence that is required. These programmable resistor arrays are used as one means to increase the frequency stability of a fully-integrated free-running oscillator beyond what is required simply for UART operation, and to instead achieve a much more precise frequency stability of +/−0.5% in order to meet stricter CAN (Control Area Network) specifications—in the presence of variations in temperature from −40 C to 125 C, variations in supply voltage from 1.8V to 3.6V, and variations in component manufacturing of various types.

Figure 18:
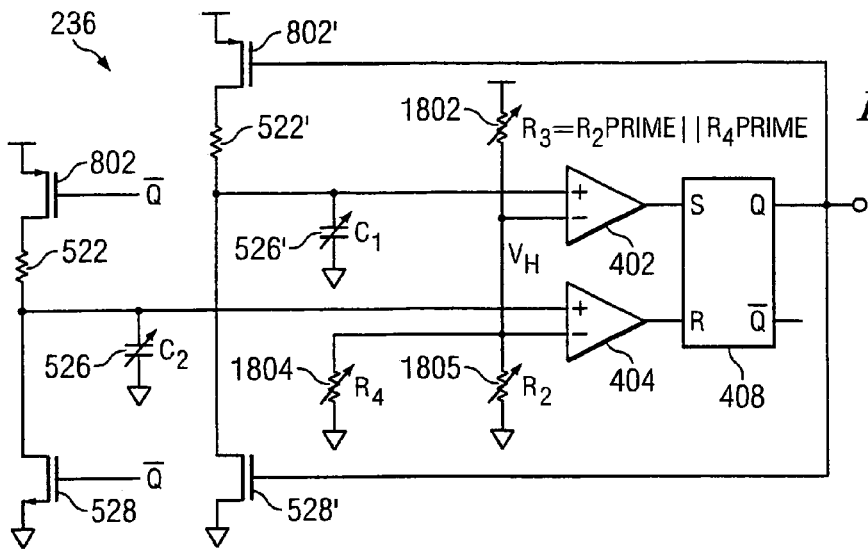
FIG. 18 illustrates a schematic diagram of the precision oscillator including a programmable resistor array.

Referring now to FIG. 18, there is provided a further illustration of the precision oscillator 236 with an alternative and improved embodiment of the voltage reference circuit 406. As before, there are two bottom resistors 1804 and 1806 designated R2 and R4 respectively, making up two independent arrays. In this implementation, however, there are also two top resistors in parallel, as opposed to just one, forming what will be considered a single resistor array 1802 designated R3=R2prime∥R4prime. R2prime is chosen to be the same material as R2, and R4prime is chosen to be the same material as R4. Also, R2prime and R4prime are chosen to be a factor of K times the value of R2 and R4 respectively on their nominal programmed settings, i.e. R2prime=K*R2 and R4prime=K*R4, where the value of K is the same in both equations. As a result of these choices, process variations in R2prime∥R4prime will track and approximately cancel process variations in R2∥R4, and thus the overall process variation of the voltage reference temperature coefficient is significantly reduced compared to the case where the top resistor consists of only a single resistive material. Also, in this implementation, each of the three resistor arrays R3=R2prime∥R4prime, R2, R4, is made digitally programmable in its resistance value.

As before, the voltage reference circuit 406 is connected to the negative inputs of comparators 402 and 404. The outputs of comparators 402 and 404 are connected to the S and R inputs of an SR latch 408. The Q and Q-Bar outputs of the SR latch 408 are connected to the RC timing block circuit 410. The RC timing block circuit 410 consists of the transistors 802, 802', resistor 522, 522', variable capacitor 526, 526' and transistor 528, 528' as was described previously with respect to FIG. 8.

The digitally programmable resistor arrays, consisting of resistors R3=R2prime∥R4prime, R2, and R4, comprising the digitally programmable resistor divider network are configured to minimize the effects of end resistance, switch resistance, and sub-threshold leakage currents of switches on the overall temperature coefficient generated by the resistor divider network. These three effects add significant process variation and non linearity to what would otherwise be a very linear and well-controlled temperature coefficient of the resistor divider network, as well as making this temperature coefficient larger in value than it would otherwise be. Process variation and non linearity of the resistor voltage divider temperature coefficient directly translate into process variation and non linearity of the overall oscillator temperature coefficient. The overall accuracy of this particular implementation of the precision oscillator must go beyond what is required simply for UART operation, and instead achieve a much more precise frequency stability of +/−0.5 percent from −40 C to 125 C, in order to meet stricter CAN (Control Area Network) specifications. Since it is very expensive to trim the temperature coefficient of each part individually—because this requires heating and/or cooling the part in an accurate temperature-controlled environment—this +/−0.5% accuracy budget must also include the part-to-part variation of the overall oscillator temperature coefficient.

Switches connected to resistors must be implemented as MOS devices in the triode region of operation, which have high, nonlinear, poorly-controlled temperature coefficients that degrade the otherwise low, linear, well-controlled temperature coefficients of the programmable resistor array—making it difficult to compensate for the temperature coefficient of the overall oscillator in a PTAT/CTAT fashion. In order to control this, the topology of the resistor network is designed so that the ratio of total pure resistance to total end/switch resistance on any particular programmable setting is always kept large enough that the temperature coefficient contribution from the total end/switch is negligible in the weighted sum. The weighted-sum equation for a resistor temperature coefficient is given by:

$$TCres = [2*Rend/(Rpure + 2*Rend)]*TCend + [Rpure/(Rpure + 2*Rend)]*TCpure,$$

where the weighting is the respective fraction that end resistance and pure resistance contribute to the overall series combination. The factor of 2 occurs in the equation, because there is 1 parasitic end resistance on each side of the pure resistance, making a total of 2 end resistances per 1 pure resistance, for each resistor.

For P+ non-silicided poly resistors in a typical 0.18 μm process, such as those used in the programmable R4 array, pure resistances have tempcos of −75 ppm/C, while end resistances have tempcos of −1692 ppm/C. In this case, the pure resistance tempco is much smaller than the end resistance tempco, so end resistances have a major impact on the overall temperature coefficient of the P+ resistors used in the R4 array. Moreover, the value of these end resistors can vary by as much as +/−50% from one chip to another, causing the overall temperature coefficients of the P+ poly resistors to vary significantly, as predicted by the previous weighted-sum equation. For this reason, all P+ poly resistors are implemented in parallel within the programmable R4 resistor array, so that only one resistor in the parallel combination is connected for a given setting, while all other parallel resistors are disconnected from the array, as will be explained. In this way, the R4 resistor array has only two end resistances and one pure resistance contributing to the overall resistance on any particular programmable setting. If each of the P+ poly resistors in the array are then made long enough and wide enough in the design, such that the value of the pure resistance is made orders of magnitude greater than the value of the two end resistances, then the overall resistor temperature coefficient will be very close to the well -controlled value of −75 ppm/C, as desired.

For N+ non-silicided poly resistors in a typical 0.18 µm process, such as those used in the programmable R2 array, pure resistances have tempcos of −1184 ppm/C, while end resistances have tempcos of −1372 ppm/C. In this case, the pure resistance tempco is much closer in value to the end resistance tempco, so the end resistances have a less significant impact on the overall temperature coefficient of the N+ poly resistors in R2 than they did in the case of the P+ poly resistors in R4. Although the +/−50% variation of the end resistor values still presents a problem, it is also to a lesser degree in this case, as again predicted by the weighted-sum equation. As a consequence of these facts, the N+ poly resistors do not need to be implemented in parallel, but can instead be implemented in series, where a certain number of N+ poly resistors are added and subtracted from the total series sum for any given setting. This approach saves area compared to the parallel approach and is therefore preferred when end and pure resistor values are relatively close in value. The parallel approach is preferred when extremely low and well-controlled resistor tempcos need be achieved at the expense of area, as in the case of the R2 array.

Figure 19A:
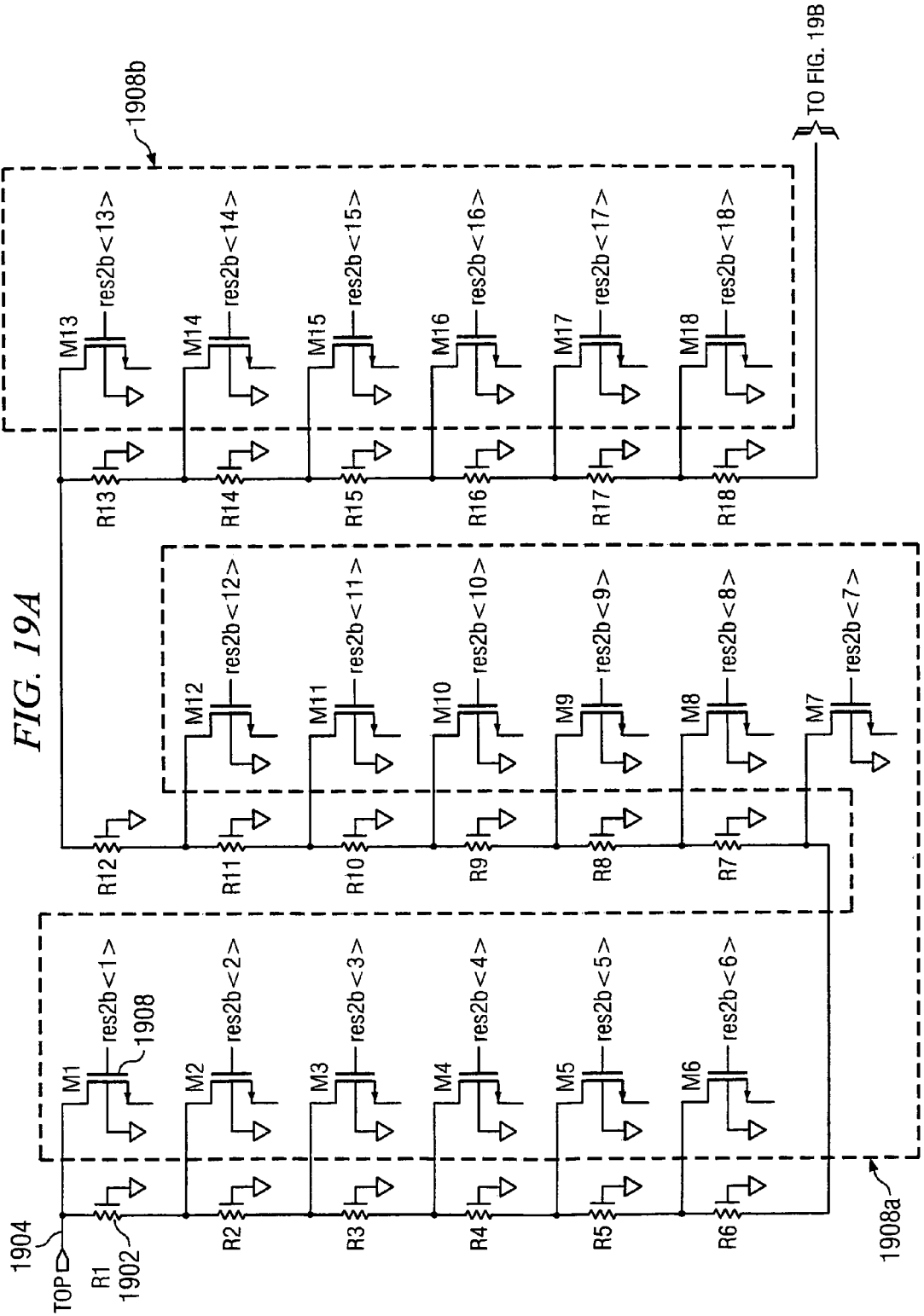
FIG. 19 is a schematic diagram of a programmable resistor array implementing a funneling scheme to control leakage currents.
Figure 19B:
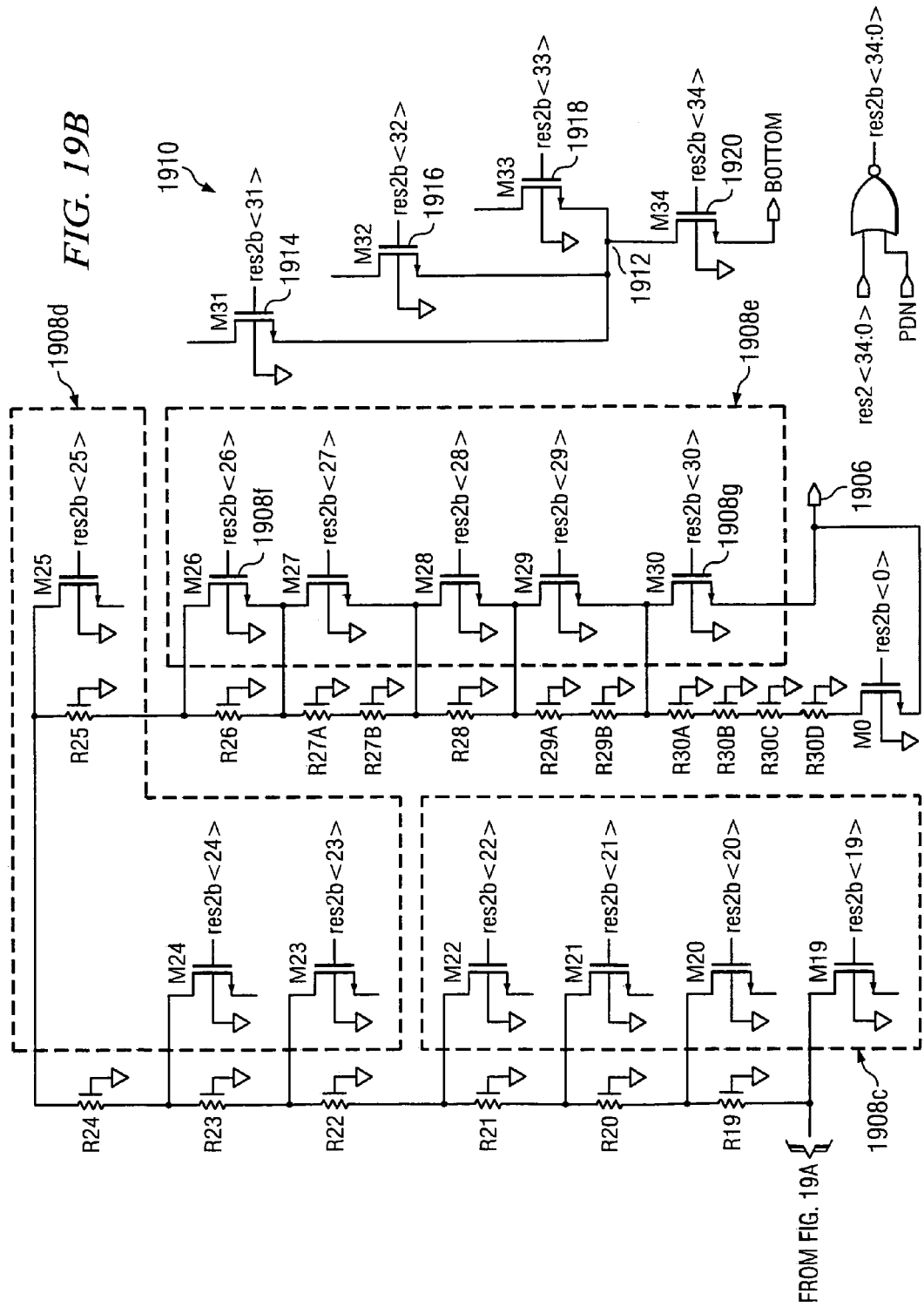

Referring now to FIG. 19, there is illustrated a schematic diagram of the programmable resistor array making up the variable resistor R2 illustrated in FIG. 18. This programmable resistor array consists of a plurality of resistors 1902, implemented in this case with N+ non-silicided polysilicon material, which are connected in series between a first node 1904 and a second node 1906. Note that other resistive materials may also be used to implement these resistors, depending on the details of the particular fabrication process. Each transistor 1908 acts as a switch to disconnect its associated resistor 1902 from the array, having its drain node attached to the top of each resistor 1902 and its source node attached to special circuitry which limits the sub-threshold leakage of the switch when it is turned off, as will be explained. When each transistor 1908 is turned on, the top node of the associated resistor 1902 is shorted to the bottom node 1906 of the series resistor array through the leakage funnel circuitry 1910, effectively shorting out the associated resistor and all resistors succeeding it in the series array so that they do not contribute to the total series resistance. When each transistor 1908 is turned off, the associated resistor node is left free, so that the resistor 1902 can contribute to the overall series resistance of the variable resistor array, assuming all transistors preceding it in the array are also switched off. In this off state, the sub-threshold leakage of the switch 1908 is significantly reduced by the aforementioned special leakage funnel circuitry 1910.

Note that the bulk node of each transistor within the programmable resistor array is connected to ground.

The following describes the sequence of turning on/off switches in the R2 array so as to program it to a particular resistance value. Assuming all switches are turned on to begin with, node 1904 is shorted to node 1906 through all of the switches and leakage circuitry, resulting in a resistance of zero. Next, the transistor switch closest to node 1904 is turned off. The top-most resistor in the series array, and only this particular resistor, is now connected between node 1904 and node 1906. Next this switch remains off, and the switch directly succeeding this switch in the array is turned off. The top -most resistor and the resistor directly succeeding it are now both connected in series between node 1904 and node 1906. Continuing this process, each time the next switch in sequence is turned off, an additional resistance is added to the series sum, until finally all resistors in the array are connected in series when all switches are turned off. Note that, at bare minimum for this scheme to work, only one switch really needs to be turned on for any given resistance setting, since it effectively shorts out all the switches succeeding it in sequence whether they are on or off. However, having all successive switches on in sequence, as described, results in a lower effective parasitic switch resistance to node 1906, and therefore less degrading effect from the high, nonlinear, and poorly-controlled switch resistance on the very low, linear, and well-controlled temperature coefficient of the series polysilicon resistors.

The "leakage funnel" 1910 consists, in one particular implementation, of three transistors 1914, 1916, 1918 forming the top branch of a tree, and a fourth transistor 1920 forming the root branch of the tree. The top-branch transistors 1914, 1916, 1918 have their drain/source path connected between associated groupings of transistor switches attached to the resistor array, hereafter referred to as leaves, and an intermediate node 1912 inside the tree. The root transistor 1920 has its drain/source path connected between intermediate node 1912 and the bottom node 1906 of the series resistor array. One skilled in the art would appreciate that the leakage funnel may include more or less than 2 levels of branches, with any number of transistors on the various branch levels and any number of switches acting as leaves attached to the resistor array, so long as a tree topology is formed that funnels leakage from a larger number of leaf transistors on the top-most level to a smaller number of root transistors on the bottom-most level.

A first transistor 1914 of the top branch of the leakage funnel 1910 has its drain connected to the source of each of the leaf transistors 1908a within a first portion of the resistor array. A second transistor 1916 of the top branch of the funnel has its drain connected to the source of each of the leaf transistors 1908b within a second portion of the resistor array. And a third transistor 1918 of the top branch of the funnel has its drain connected to each of the sources of the leaf transistors 1908c within a third portion of the resistor array.

The previous paragraph described a leakage funnel that was implemented in an explicit fashion with branch transistors separate from the leaves of the resistor array. A leakage funnel can also be implemented in an implicit fashion within the array itself by generating the branches from leaves that will later be turned off in the previously described switching sequence. Such an implicit leakage funnel is implemented with transistor groupings 1908d and 1908e within a fourth and fifth portion of the resistor array. Leaf transistors 1908d have their sources connected to the drain node of leaf transistor 1908f within the array. When leaf transistor 1908f is turned off in the switching sequence, it acts as the root branch of a tree with leaves consisting of the three transistors 1908d which were turned off previously. As transistors succeeding 1908f are subsequently turned off in sequence, extra branch levels are added to this tree, with a single transistor being added per new branch level. At the end of the sequence, when every switch in the array is ultimately turned off, transistor 1908g becomes the final root of the tree.

Implicit leakage funnels can be profitably implemented at the end of the resistor array when the overall series poly resistance becomes very large, in which case the extra switch resistance introduced by the large number of extra branch levels can be tolerated with negligible effect on the very low, linear, and well-controlled temperature coefficient of the series poly resistance. Adding extra switch resistance towards the beginning of the array is problematic, because the total series resistance is very small and therefore easily affected by the high, nonlinear, and poorly controlled temperature coefficient of the switches. The advantage of implicit leakage trees is that they tend to do a better job of reducing leakage than explicit trees, as well as saving area and reducing the complexity of the required control logic. For these reasons, explicit leakage funnels are used at the beginning of the R2 array, and implicit leakage funnels are used at the end of the R2 array.

The control signals applied to the gates of the transistors within the R2 resistor array are provided in a manner such that the leakage currents of the transistors are minimized via the leakage funnels, and thus the impact on the temperature coefficient of the programmable resistor array is minimized. The transistors forming the switches in the digitally programmable resistor array illustrated in FIG. 19 must be large enough (i.e. must be sized with big enough W/L) to keep their on-resistance relatively small, such that on any given setting, the on-resistance contributes negligibly compared to the pure part of the resistor. This on-resistance has a high nonlinear temperature coefficient, and varies greatly in value due to manufacturing. In modern submicron processes (e.g. a 0.18 μm process), when the transistors are turned off, they still draw a significant current since the sub-threshold leakage of the transistor is so large. Unfortunately, making the size of the transistor bigger to reduce on -resistance also has the adverse effect of increasing this leakage current. In a typical 0.18 μm process, given a choice of W/L=20 um/0.18 um for each switch, which is the required W/L to keep on-resistance sufficiently low, we are forced to endure sub-threshold leakage currents on the order of a few nano-amps per switch at 85C.

The uncompensated temperature coefficient of the oscillator is roughly −70 ppm/C, which requires a PTAT temperature coefficient from a programmable resistor array of approximately +70 ppm/C to cancel out. To keep the overall power consumption of the oscillator low, the bias current within the programmable resistor array is on the order of a few 10's of micro-amps. With such a small bias current, leakage on the order of a few nano-amps per switch, times ~30 switches, will significantly perturb such a low temperature coefficient as +70 ppm/C. Additionally, these subthreshold leakage currents exhibit an exponential dependence on temperature and threshold voltage, adding significant non-linearity and process variation to the programmable resistor array's temperature coefficient.

The number of switches that are turned off at any particular time are controlled such that once a grouping of transistor switches has been turned off, one of the transistor switches associated with this grouping within the transistor funnel 1910 is also turned off. As a result, only the leakage current of a single transistor is affecting the temperature coefficient of the circuit for that particular grouping of switches, rather than the leakage current of every single. transistor in the group.

Figure 20:
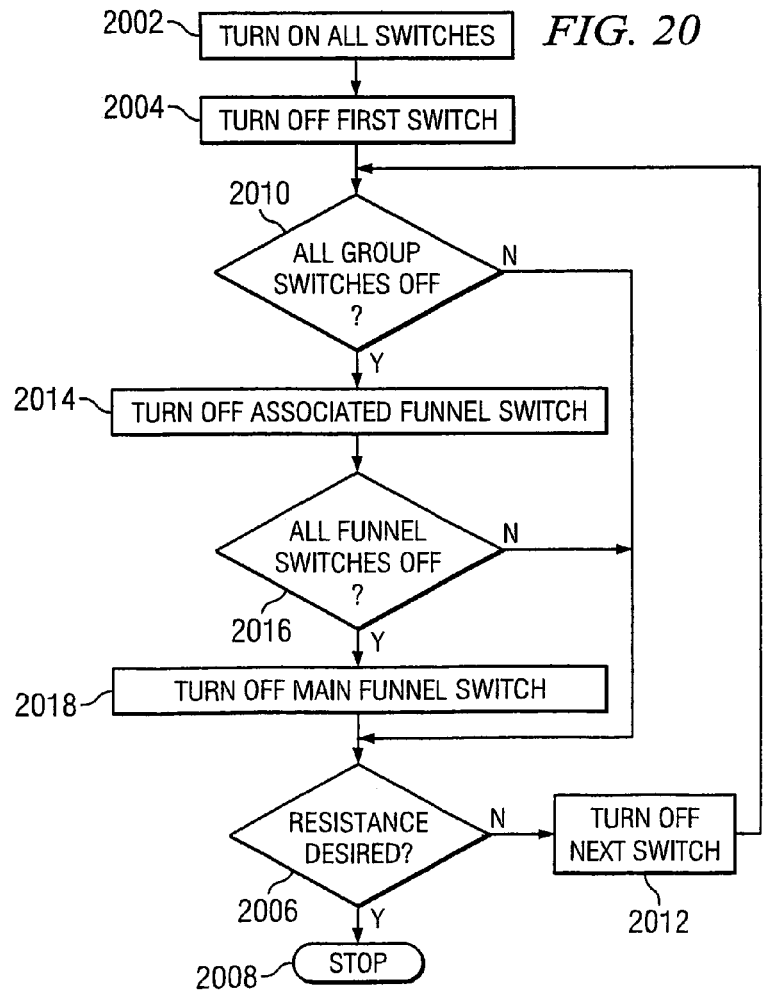
FIG. 20 is a flow diagram illustrating the process for controlling the programmable resistor area of FIG. 19.

This process is more fully illustrated in FIG. 20. Digital logic, implemented in Verilog code, controls the switching of the transistors in the trees and properly adjusts the funneling for different settings. The process begins at step 2002 wherein all of the switches are turned on and the programmable resistor array provides a resistance of zero. The first switch, closest to node 1904, is turned off at step 2004. Once this first switch has been turned off, a particular resistance associated with this first switch is provided by the programmable resistor array, and control passes to inquiry step 2010 where a determination is made if all switches within a particular group (i.e. a particular grouping of transistors connected to the same transistor of the funnel) are turned off. Thus, for example, a determination is made if all of the switches 1908a and/or all of the switches 1908b and/or all of the switches 1908c have been turned off. If inquiry step 2010 determines that no groups have all their transistors turned off, control passes to inquiry step 2006. Inquiry step 2006 determines if the programmable resistor array is providing the desired resistance. If so, the process is completed at step 2008. Otherwise, if the desired resistance is not yet high enough, the next switch (directly succeeding the previous switch) is turned off at step 2012 and control passes back to step 2010.

If inquiry step 2010 determines that all of a particular group of switches have been turned off, then the associated funnel switch is turned off at step 2014. Thus, for example, if all of the switches 1908a had been turned off, then switch 1914 would be turned off within the transistor funnel 1910. This has the effect of having the leakage current associated with switch 1914 being the only leakage current affecting the temperature coefficient of the programmable resistor array for the particular grouping of transistors 1908a, rather than having the cumulative effect of the leakage current of all of the switches in 1908a affecting the temperature coefficient. The process is similar for the switches 1908b associated with switch 1916 and the switches 1908c associated with switch 1918. Inquiry step 2016 determines if all three of the funnel transistor switches 1914, 1916 and 1918 have been turned off. If not, control passes back to step 2006 to determine if the desired resistance has been achieved. However, if inquiry step 2016 determines that each of the funnel switches 1914 through 1918 have been turned off, then the main funnel switch 1920 is also turned off at step 2018. This causes the leakage current provided by the entire group of switches consisting of transistors 1908a, 1908b and 1908c to have the effect of only the single transistor 1920, rather than the cumulative effects of all of the transistors 1908a, 1908b and 1908c. Control is then finally returned to inquiry step 2006 to determine if the desired resistance has been achieved. Note that no special control logic is required for the operation of the implicit leakage funnel implemented with transistors 1908d and 1908f. So long as the proper switching sequence in FIG. 20 is followed, the root branch transistors in 1908f take care of shutting themselves off properly on relevant settings.

The above described funneling approach works well in cases where larger leakages on the order of a few nano-amps may be tolerated, but the area of the programmable resistor array needs to be conserved. Larger leakages may be tolerated in the case of the N+ poly R2 array because the tempco is a fairly large value of −1184 ppm/C. However, in the case of the P+ poly R4 network, leakage must be kept on the order of pico-amps or less, because the tempco is a very small −75 ppm/C. A second scheme will now be explained that achieves femto-amp sub-threshold leakage in a typical 0.18 um process, and that works extremely well in the case of the R4 array. The only drawback to this scheme is that it requires more area to implement.

Figure 21A:
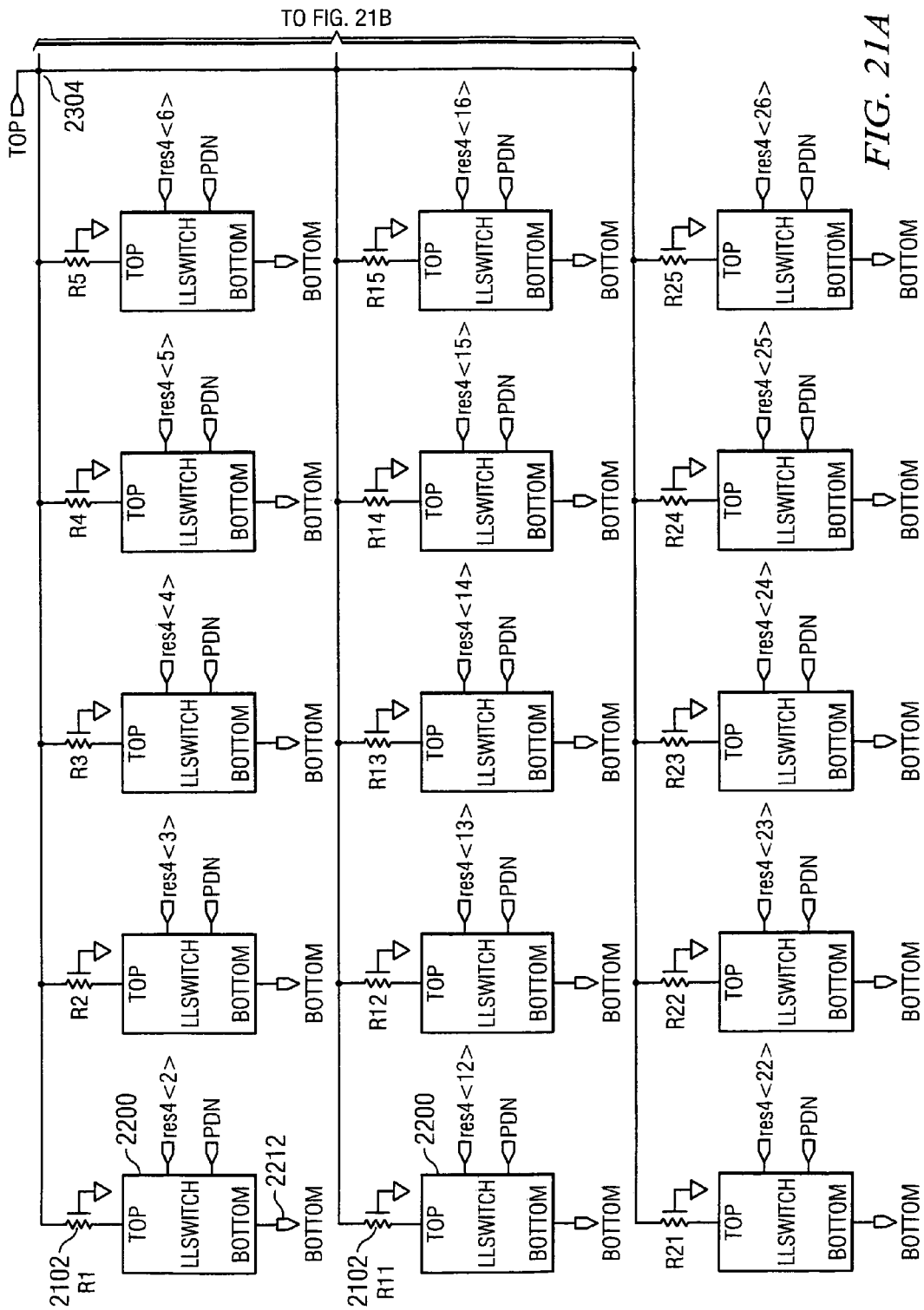
FIG. 21 illustrates a further embodiment of a programmable resistor array implemented utilizing low leakage switches.
Figure 21B:
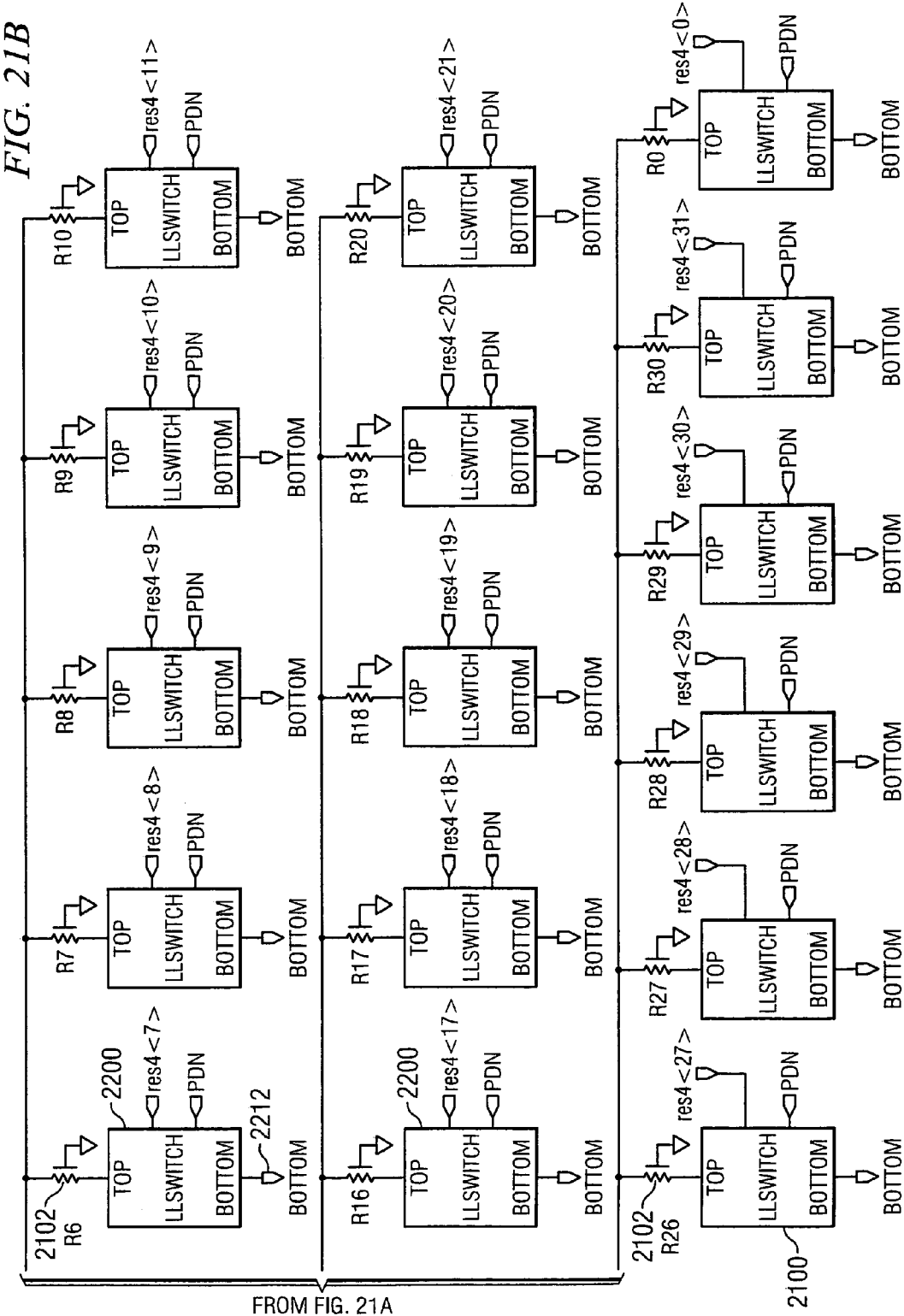

Referring now to FIG. 21, there is illustrated the programmable resistor array forming the resistor R4. The programmable resistor array illustrated in FIG. 21 includes a plurality of P+ non-silicided polysilicon resistors 2102 all in parallel with one another. Note that other resistive materials may also be used to implement these resistors, depending on the details of the particular fabrication process. For any given setting, control logic ensures that only one resistor is switched in and that the remaining resistors are all switched out. The switching is accomplished using the circuitry included inside box 2200, as will be described momentarily. Having one resistor switched in and 29 resistors switched out, on any given setting, creates a great deal of sub-threshold leakage current through the 29 switches that are off, assuming that the circuitry inside box 2200 were to be implemented with a single transistor switch. As already mentioned, for a 20 um/0.18 um regular VT transistor, this sub-threshold leakage is a few nano-amps per switch at 85C in a typical 0.18 um process. Accounting for all 29 transistors that are off, total leakage current of around 100 nano-amps would be expected, which would significantly affect the required low +70 ppm/C temperature coefficient of the voltage reference, given that the bias current in the resistor divider is only 10's of micro-amps.

Figures 22, 23:
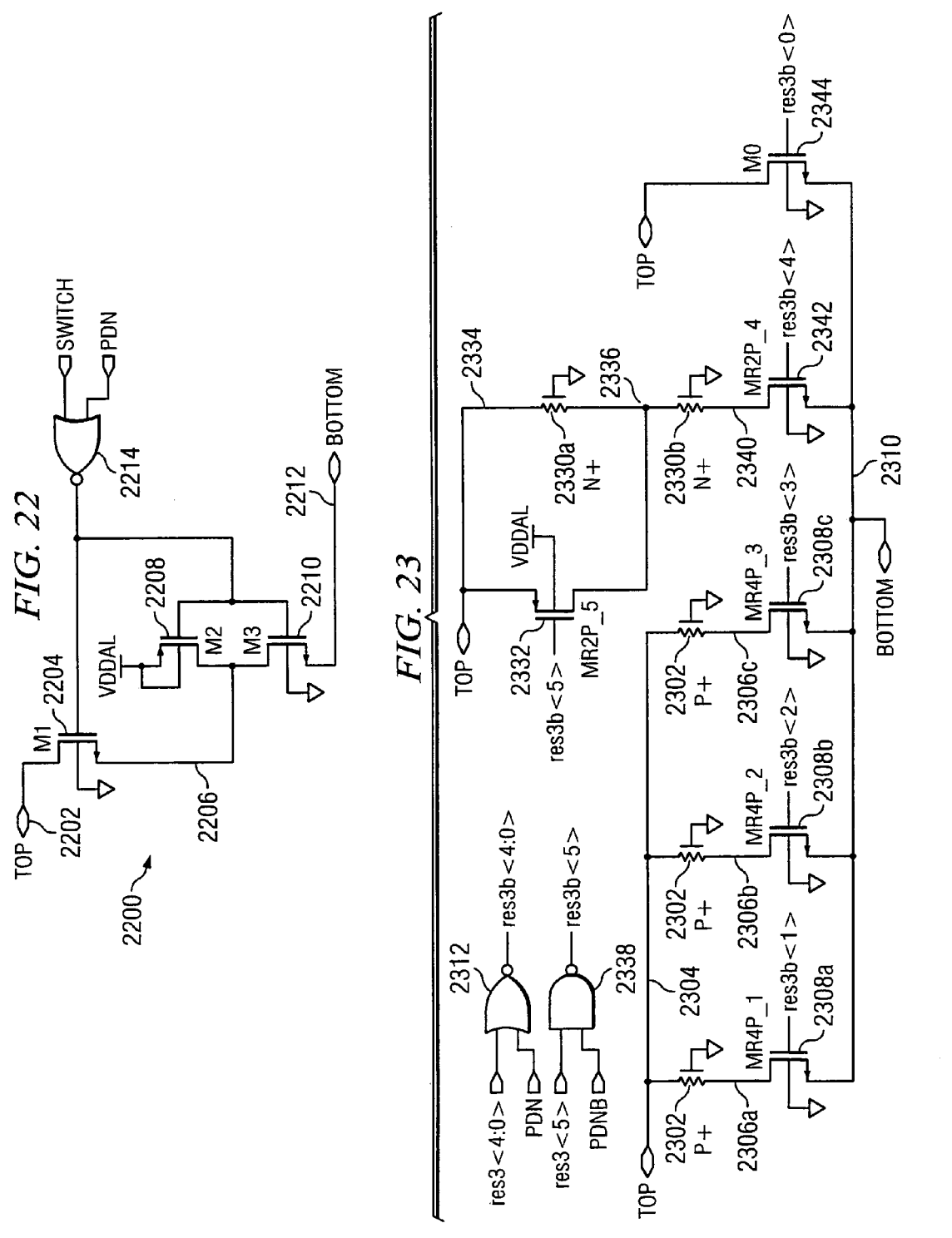

To solve this problem, a new circuit termed a "low-leakage switch" is proposed as a one-to-one replacement for the leaky single transistor switches which would otherwise have to be used to switch in and out the parallel P+ poly resistors in FIG. 21. This new low-leakage switch is illustrated in FIG. 22. A top node 2202 is connected to the drain of transistor 2204 and to the P+ resistor associated with the low leakage switch 2200. The transistor 2204 has its drain/source path connected between node 2202 and node 2206. A pair of transistors 2208 and 2210 are connected in series between the gate and source of transistor 2204 to create a negative gate-to-source voltage when transistor 2204 is turned off, and thereby reduce the sub-threshold leakage current. The source/drain path of transistor 2208 is connected between VDD and node 2206. The drain/source path of transistor 2210 is connected between node 2206 and node 2212. The bulk of transistors 2204 and 2210 are connected to ground, and the bulk of transistor 2208 is connected to its drain. The gates of transistors 2204, 2208 and 2210 are connected to the output of NOR gate 2214. NOR gate 2114 receives an input signal SWITCH and an input signal PDN. The low leakage switches operate by pulling the source of transistor 2204 above its gate by a few hundred milli-volts when either of the two input signals SWITCH or PDN goes high. This results in a negative gate-to-source voltage (VGS) for switch 2204, which reduces the current leakage of 2204 from nano-amps to femto-amps in a typical 0.18 um process.

Referring now back to FIG. 21, there is illustrated the programmable resistor array, including the low leakage switch 2200 described in FIG. 22. In this case, a parallel connection of a plurality of resistors 2102 have a first end connected to a top node 2104 of the programmable resistor array. The second end of resistors 2102 are each connected to node 2102 of a low leakage switch 2200 as illustrated in FIG. 22. The node 2212 of low leakage switch 2200 is the output of the programmable resistor array. The low leakage switch approach works well in cases where leakage needs to be extremely small, but larger areas may be tolerated for the bigger low leakage switches. The "leakage funnel" scheme described in the context of the programmable R2 array and the "low leakage switch" scheme described above in the context of the programmable R4 array both operate together to eliminate the disastrous effects of leakage current on the temperature coefficient of the voltage reference network, and therefore on the temperature coefficient of the overall oscillator.

Referring now to FIG. 23, there is illustrated the programmable resistor array used to provide the variable resistor 1802 designated R3=R2prime∥R4prime in the voltage reference circuit of FIG. 18. As already explained, it has been determined that using a parallel combination of R2prime∥R4prime resistors—where R2prime is the same material as R2, where R4prime is the same material as R4, and where R2prime=K*R2 and R4prime=K*R4 with K being the same factor for both equations, provides a situation wherein the process variations of the top resistor array R2prime∥R4prime and bottom resistor arrays R2∥R4 tend to cancel each other out. The top resistors R3=R2prime∥R4prime are made digitally programmable to allow coarse tuning of the programmable voltage reference temperature coefficient, while the bottom resistors R2 and R4 are also each made separately digitally programmable to allow a fine tuning of the programmable voltage reference temperature coefficient. The coarse tuning is implemented in such a way as to triple the tuning range of the programmable resistor array beyond what could have been achieved via the fine tuning alone, while adding very little additional area.

The resistors 2302 comprise P+ poly resistors similar to the P+ poly resistors utilized in the programmable resistor array for variable resistor R4. The resistors 2302 are connected in parallel with each other between a first node 2304 and second nodes 2306a, 2306b and 2306c, respectively. The second nodes 2306a, 2306b and 2306c are connected to the drains of a set of transistors 2308a, 2308b and 2308c, respectively. The transistors 2308a, 2308b and 2308c have their drain/source path connected between nodes 2308a, 2308b and 2308c, respectively, and node 2310. The bulks of transistors 2308 are connected to ground. The gates of transistors 2308 are connected in such a way as to receive control bits from NOR gate 2312.

In parallel with the P+ poly resistors 2308 are N+ poly resistors 2330. The N+ poly resistors 2330 are in series with each other. A first transistor switch 2332 is used to turn on resistor 2330a. Resistor 2330a is connected between node 2334 and node 2336. Transistor 2332 has its source/drain path connected between node 2334 and node 2336. The bulk of transistor 2332 is connected to VDD and the gate of transistor 2332 is connected so as to receive a control signal from NAND gate 2338. Resistor 2330b is connected between node 2336 and node 2340. Transistor 2342 is in series with resistor 2330b and has its drain/source path between node 2340 and node 2310. The bulk of transistor 2342 is connected to ground, and the gate of transistor 2342 is connected to a control signal from NOR gate 2312. Transistor 2344 has its drain/source path connected between node 2334 and node 2310. The bulk of transistor 2344 is connected to ground, and the gate of transistor 2344 is connected to receive a control signal from NAND gate 2312. On any one of the three possible coarse tune settings, a P+ poly resistance is switched in on the left side and an N+ poly resistance is switched in on the right side.

By applying the desired control signals to the transistors of the R3 programmable resistor array, the R3 value is coarse-tuned such that the R4prime P+ and R2prime N+ top resistors are set to one of three possible K-factor multiples of the corresponding R4 P+ and R2 N+ bottom resistors. In this way, the process variations of the top and bottom resistors tend to cancel each other out, regardless of the coarse tune setting.

Although the preferred embodiment has been described in detail, it should be understood that various changes, substitutions and alterations can be made therein without departing from the spirit and scope of the invention as defined by the appended claims.

What is claimed is:

1. A free running clock circuit, comprising:
a switching circuit for switching between first and second logic states at a predetermined frequency, said switching circuitry changing between said first and second logic states based upon a trip voltage, said switching circuitry having an inherent temperature profile associated therewith; and
a voltage divider circuit for outputting a defined trip voltage that is compensated over temperature to offset the temperature profile of said switching circuit to provide an overall temperature compensated operation for said free running clock circuit, the voltage divider circuit having a top digitally programmable resistor array comprised of a pair of resistor arrays in parallel connected in series with at least two bottom digitally programmable resistor arrays connected in parallel between two supply terminals of differing voltages;
wherein process variations in the top digitally programmable resistor array comprised of the pair of resistor arrays in parallel approximately cancel process variations in the at least two bottom digitally programmable resistor arrays connected in parallel.

2. The free running clock circuit of claim 1, wherein said at least two bottom digitally programmable resistor arrays are made of different materials and have different temperature coefficients.

3. An integrated system on a chip with serial asynchronous communication capabilities, comprising:
processing circuitry for performing predefined digital processing functions on the chip;
a free running clock circuit for generating a temperature compensative clock, comprising:
a switching circuit for switching between first and second logic states at a predetermined frequency, said switching circuitry changing between said first and second logic states based upon a trip voltage, said switching circuitry having an inherent temperature profile associated therewith; and
a voltage divider circuit for outputting a defined trip voltage that is compensated over temperature to offset the temperature profile of said switching circuit to provide an overall temperature compensated operation for said free running clock circuit, the voltage divider circuit having a top digitally programmable resistor array comprised of a pair of resistor arrays in parallel connected in series with at least two bottom digitally programmable resistor arrays connected in parallel between two supply terminals of differing voltages;
wherein process variations in the top digitally programmable resistor array comprised of a pair of resistor arrays in parallel approximately cancel process variations in the at least two bottom digitally programmable resistor arrays connected in parallel;
an asynchronous on-chip communication device for digitally communicating with an off-chip asynchronous communication device, which off-chip asynchronous communication device has an independent time reference, which communication between said on-chip communication device and said off-chip asynchronous communication device is effected without clock recovery, said asynchronous on-chip communication device having a time-base derived from said temperature compensated clock; and
wherein said temperature compensated clock provides a time reference for both said processing circuitry and said asynchronous on-chip communication device.

4. The integrated system of claim 3, wherein said at least two bottom digitally programmable resistor arrays are made of different materials and have different temperature coefficients.

5. The integrated system of claim 3, wherein said at least two bottom digitally programmable resistor arrays have positive temperature coefficients.

6. The integrated system of claim 3, wherein said top digitally programmable resistor array is programmed to have a fixed factor of N+ and P+ resistors proportional to the at least two bottom digitally programmable resistor arrays.

7. The integrated system of claim 3, wherein the top resistor array and the at least two bottom digitally programmable resistor arrays are programmable to set the temperature coefficient of said trip voltage.

8. The integrated system of claim 3, wherein one of said at least two bottom digitally programmable resistor arrays comprises a plurality of end diffusion resistors and the other of the two bottom digitally programmable resistor arrays comprise a plurality of polycrystalline silicon resistors.

9. The integrated system of claim 3, wherein said switching circuit comprises:
a comparator circuit that is comprised of first and second comparators, each of said first and second comparators having a reference input connected to receive said temperature compensated trip voltage output by said temperature compensated trip voltage generator with the output of each of said two comparators changing logic states between a first logic state and a second logic state when the other input thereof passes said trip voltage; and
an RC timing circuit for defining when each of said two comparators switches the outputs thereof by providing a feedback that is input to the other input of each of the two comparators.

10. The integrated system of claim 9, wherein said RC timing circuit sets the frequency of said free running timing circuit and said RC timing circuit is variable.

11. The integrated system of claim 10, wherein said RC timing circuit comprises:
a first RC circuit and a second RC circuit;
said first RC circuit and said second RC circuit each comprising a resistor connected through a switching device having an associated switch input between a first supply terminal and one side of a first capacitor, the other side of said first capacitor connected to another different supply terminal wherein current is switchable through said resistor to charge said capacitor;
said first and second RC circuits having said associated switch input connected to an associated one of said two comparator outputs such that charging up of the associated one of said first capacitors will cause the voltage at the one plate thereof to be fed back to the other input of the other of said two comparators wherein the other of said two comparators will switch when the voltage on the one plate of said associated first capacitor exceeds the trip voltage.

12. A free running clock circuit, comprising:
a switching circuit for switching between first and second logic states at a predetermined frequency, said switching circuitry changing between said first and second logic states based upon a trip voltage, said switching circuitry having an inherent temperature profile associated therewith; and a digitally programmable voltage divider circuit for outputting a defined trip voltage that is compensated over temperature to offset the temperature profile of said switching circuit to provide an overall temperature compensated operation for said free running clock circuit, the voltage divider circuit comprising:

a first programmable resistor array and a second programmable resistor array connected in parallel wherein the first programmable resistor array further comprises:

a plurality of resistors connected in parallel;

a plurality of transistors, each of the plurality of transistors associated with one of the plurality of resistors; and a leakage funnel associated with at least a portion of the plurality of transistors for funneling a leakage current of a plurality of transistors into a smaller number of transistors;

a third programmable resistor array connected in series with the parallel connection of the first digitally programmable resistor array and the second digitally programmable resistor array, wherein the third programmable resistor array comprises a fourth programmable resistor array in parallel with a fifth programmable resistor array, the fourth programmable resistor array equal in magnitude to a magnitude of the first programmable resistor array times a selected constant value and the fifth programmable resistor array equal in magnitude to a magnitude of the second programmable resistor array times the selected constant value;

wherein the third programmable resistor array connected in series with the parallel connection of the first and second programmable resistor arrays are between two supply terminals of differing voltages.

13. The free running clock circuit of claim 12, wherein the first and the second programmable resistor arrays have positive temperature coefficients.

14. The free running clock circuit of claim 12, wherein said third programmable resistor array is programmed to have a fixed factor of N+ and P+ resistors proportional to the first and the second programmable resistor arrays.

15. The free running clock circuit of claim 12, wherein the third programmable resistor array and the first and the second programmable resistor arrays are programmable to set the temperature coefficient of said trip voltage.

16. The free running clock circuit of claim 12, wherein resistor array comprises a plurality of end diffusion resistors and the second resistor array comprises a plurality of polycrystalline silicon resistors.

17. The free running clock circuit of claim 12, wherein said switching circuit comprises:

a comparator circuit that is comprised of first and second comparators, each of said first and second comparators having a reference input connected to receive said temperature compensated trip voltage output by said temperature compensated trip voltage generator with the output of each of said two comparators changing logic states between a first logic state and a second logic state when the other input thereof passes said trip voltage; and an RC timing circuit for defining when each of said two comparators switches the outputs thereof by providing a feedback that is input to the other input of each of the two comparators.

18. The free running clock circuit of claim 17, wherein said RC timing circuit sets the frequency of said free running timing circuit and said RC timing circuit is variable.

19. The free running clock circuit of claim 18, wherein said RC timing circuit comprises:

a first RC circuit and a second RC circuit;

said first RC circuit and said second RC circuit each comprising a resistor connected through a switching device having an associated switch input between a first supply terminal and one side of a first capacitor, the other side of said first capacitor connected to another different supply terminal wherein current is switchable through said resistor to charge said capacitor;

said first and second RC circuits having said associated switch input connected to an associated one of said two comparator outputs such that charging up of the associated one of said first capacitors will cause the voltage at the one plate thereof to be fed back to the other input of the other of said two comparators wherein the other of said two comparators will switch when the voltage on the one plate of said associated first capacitor exceeds the trip voltage.

20. The free running clock circuit of claim 12, wherein the first and fourth programmable resistor arrays are made of a same first resistive material and further wherein the second and fifth programmable resistor arrays are made of a same second resistive material.

21. The free running clock circuit of claim 12, wherein process variations in the third programmable resistor array approximately cancel process variations in the parallel connection of the first and the second resistor arrays.

22. The free running clock circuit of claim 12, wherein the second programmable resistor array further comprises:

a plurality of resistors connected in series;

a plurality of switching transistors, each of the plurality of switching transistors associated with one of the plurality of resistors; and circuitry associated with at least a portion of each of the plurality of switching transistors for creating a negative gate to source voltage in an associated switching transistor when the switching transistor is turned off.

23. A free running clock circuit, comprising:

a switching circuit for switching between first and second logic states at a predetermined frequency, said switching circuitry changing between said first and second logic states based upon a trip voltage, said switching circuitry having an inherent temperature profile associated therewith; and a digitally programmable voltage divider circuit for outputting a defined trip voltage that is compensated over temperature to offset the temperature profile of said switching circuit to provide an overall temperature compensated operation for said free running clock circuit, the voltage divider circuit comprising:

a first programmable resistor array and a second programmable resistor array connected in parallel wherein the second programmable resistor array further comprises:

a plurality of resistors connected in series;

a plurality of switching transistors, each of the plurality of switching transistors associated with one of the plurality of resistors; and circuitry associated with at least a portion of each of the plurality of switching transistors for creating a negative gate to source voltage in an associated switching transistor when the switching transistor is turned off;

a third programmable resistor array connected in series with the parallel connection of the first digitally programmable resistor array and the second digitally programmable resistor array, wherein the third programmable resistor array comprises a fourth programmable resistor array in parallel with a fifth programmable resistor array, the fourth programmable resistor array equal in magnitude to a magnitude of the first programmable resistor array times a selected constant value and the fifth programmable resistor array equal in magnitude to a magnitude of the second programmable resistor array times the selected constant value;

wherein the third programmable resistor array connected in series with the parallel connection of the first and second programmable resistor arrays are between two supply terminals of differing voltages.

24. The free running clock circuit of claim 23, wherein the first and fourth programmable resistor arrays are made of a same first resistive material and further wherein the second and fifth programmable resistor arrays are made of a same second resistive material.

25. The free running clock circuit of claim 23, wherein process variations in the third programmable resistor array approximately cancel process variations in the parallel connection of the first and the second resistor arrays.

* * * * *